US 8,330,241 B2

(12) United States Patent
Matsukawa et al.

(10) Patent No.: US 8,330,241 B2
(45) Date of Patent: Dec. 11, 2012

(54) MAGNETIC TUNNEL JUNCTION DEVICE

(75) Inventors: Nozomu Matsukawa, Nara (JP);
Akihiro Odagawa, Osaka (JP); Akio Matsushita, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/454,696

(22) Filed: Apr. 24, 2012

(65) Prior Publication Data
US 2012/0205762 A1    Aug. 16, 2012

Related U.S. Application Data

(63) Continuation of application No. PCT/JP2011/004435, filed on Aug. 4, 2011.

(30) Foreign Application Priority Data

Aug. 17, 2010    (JP) ................... 2010-182028

(51) Int. Cl.
| H01L 29/82 | (2006.01) |
| H01L 21/00 | (2006.01) |
| G11C 11/00 | (2006.01) |
| G11C 11/14 | (2006.01) |

(52) U.S. Cl. .................. 257/421; 257/E21.665; 438/3; 365/158; 365/171

(58) Field of Classification Search ............... None
See application file for complete search history.

(56) References Cited

U.S. PATENT DOCUMENTS
6,611,405 B1    8/2003    Inomata et al.
2004/0065906 A1    4/2004    Asao FOREIGN PATENT DOCUMENTS
| JP | 2001-156357 | 6/2001 |
| JP | 2002-057381 | 2/2002 |
| JP | 2004-079632 | 3/2004 |

OTHER PUBLICATIONS

Mitani, et al., "Structure and tunnel magnetoresistance in Fe/MgF$_2$/Co junctions with an oxide seed layer on an Fe bottom electrode", Journal of Applied Physics, vol. 91, No. 10, May 2002, pp. 7200-7202.

Kwon, et al., "Effect of F-inclusion in nm-thick MgO tunnel barrier", Current Applied Physics, vol. 9, 2009, pp. 788-791.

Shimbo, et al., "Effect of Fluoride Addition on Crystal Growth of MgO", Journal of the Ceramic Society of Japan, vol. 97, 1989, pp. 857-863.

*Primary Examiner* — Hoang-Quan Ho
(74) *Attorney, Agent, or Firm* — Hamre, Schumann, Mueller & Larson, P.C.

(57) ABSTRACT

The magnetic tunnel junction device of the present invention includes a first ferromagnetic layer, a second ferromagnetic layer, an insulating layer formed between the first ferromagnetic layer and the second ferromagnetic layer. The insulating layer is composed of fluorine-added MgO. The fluorine content in the insulating layer is 0.00487 at. % or more and 0.15080 at. % or less. This device, although it includes a MgO insulating layer, exhibits superior magnetoresistance properties to conventional devices including MgO insulating layers. The fluorine content is preferably 0.00487 at. % or more and 0.05256 at. % or less.

5 Claims, 16 Drawing Sheets

MAGNETIC TUNNEL JUNCTION DEVICE

This application is a Continuation of PCT/JP2011/004435 filed on Aug. 4, 2011, which claims foreign priority of Japanese Patent Application No. 2010-182028 filed on Aug. 17, 2010, the entire contents of both of which are incorporated herein by reference.

BACKGROUND OF THE INVENTION

1. Field of the Invention

The present invention relates to a magnetic tunnel junction device having a layered structure of ferromagnetic layer/insulating layer/ferromagnetic layer, in which an electrical resistance value between the ferromagnetic layers via the insulating layer changes depending on the relationship between the magnetization directions of the ferromagnetic layers that sandwich the insulating layer.

2. Description of Related Art

A magnetic tunnel junction device having a layered structure in which an insulating layer is sandwiched between a pair of ferromagnetic layers is known. In the magnetic tunnel junction device, an electrical resistance value between the pair of ferromagnetic layers via the insulating layer changes depending on the relationship between the magnetization directions of the ferromagnetic layers that sandwich the insulating layer. This change in resistance value is referred to as magnetoresistance or magnetoresistance change. The magnetic tunnel junction device has a structure in which, for example, one (a pinned layer) of the ferromagnetic layers that sandwich the insulating layer has a fixed magnetization direction and the other ferromagnetic layer (a free layer) has a magnetization direction that can be changed. In this structure, the electrical resistance value between the pinned layer and the free layer changes when the magnetization direction of the free layer changes and the relationship between the magnetization directions of the pinned layer and the free layer changes from parallel to antiparallel and from antiparallel to parallel.

As an insulating layer for the magnetic tunnel junction device, a magnesium oxide (MgO) layer and a magnesium fluoride ($MgF_2$) layer are known (see JP 2001-156357 A).

S. Mitani et al., "Structure and tunnel magnetoresistance in Fe/$MgF_2$/Co junctions with an oxide seed layer on an Fe bottom electrode", Journal of Applied Physics, vol. 91 (2002), pp. 7200-7202 shows that a $MgF_2$ insulating layer with reduced pinholes and reduced leakage current is formed by inserting a MgO seed layer. FIG. 14 shows the structure of a magnetic tunnel junction device disclosed in Mitani et al. A device 601 shown in FIG. 14 has a layered structure of Fe layer 603/MgO layer 604/$MgF_2$ layer 605/Co layer 606 on a substrate 602. The MgO layer 604 is a seed layer for forming the $MgF_2$ layer 605 on the Fe layer 603. The MgO layer 604 is a separate layer from the $MgF_2$ layer 605, and thinner than the $MgF_2$ layer 605. However, the magnetic tunnel junction device of Mitani et al. shows a magnetoresistance ratio of less than 1% at room temperature and 10% at a temperature of 4.2 K. The performance of the device of Mitani et al. is significantly lower than that of a conventional magnetic tunnel junction device with a magnetoresistance ratio of several tens of percent or more at room temperature.

J. H. Kwon et al., "Effect of F-inclusion in nm-thick MgO tunnel barrier", Current Applied Physics, vol. 9 (2009), pp. 788-791 discloses a technique for forming a modified insulating layer made of oxyfluoride by oxidizing an aluminum metal layer or a magnesium metal layer in fluorine-containing oxygen. FIG. 15A and FIG. 15B show FIG. 5 of Kwon et al. FIG. 15A and FIG. 15B each show a barrier height for tunneling current (barrier height for tunneling electrons) in an oxyfluoride insulating layer disclosed in Kwon et al. A barrier height for tunneling current is an electrical evaluation index indicating the quality of an insulating layer (tunnel barrier). FIG. 15A shows an example in which a top electrode and a bottom electrode are made of aluminum (Al), and an insulating layer is a layer ($AlO_x$) obtained by merely oxidizing an aluminum metal layer or a layer (AlOF) obtained by oxidizing an aluminum metal layer in fluorine-containing oxygen. A solid line and a dotted line indicate the barrier height of the $AlO_x$ layer and that of the AlOF layer, respectively. FIG. 15B shows an example in which a top electrode and a bottom electrode are made of magnesium (Mg), and an insulating layer is a layer (MgO) obtained by merely oxidizing a magnesium metal layer or a layer (MgOF) obtained by oxidizing a magnesium metal layer in fluorine-containing oxygen. A solid line and a dotted line indicate the barrier height of the MgO layer and that of the MgOF layer, respectively.

As shown in FIG. 15A, the AlOF layer has a higher barrier height than the $AlO_x$ layer. On the other hand, as shown in FIG. 15B, there is no difference in the barrier height between the MgOF layer and the MgO layer. That is, Kwon et al. discloses that the addition of fluorine during oxidation of aluminum increases the barrier height of the resulting insulating layer but no such effect as seen in aluminum is not obtained by adding fluorine during oxidation of magnesium.

Mitsuo Shimbo et al., "Effect of fluoride addition on crystal growth of MgO", Nippon Seramikkusu Kyokai Gakujutsu Ronbunshi (Journal of the Ceramic Society of Japan), vol. 97 (1989), pp. 857-863 discloses the effect of fluoride on the crystal growth of MgO. More specifically, it shows that the crystal growth of MgO is accelerated at temperatures above 900° C. by adding fluoride during sintering of MgO powder into MgO ceramic bulk. FIG. 16 shows FIG. 3 of Shimbo et al. FIG. 16 shows the effect of $MgF_2$ addition on the grain size of sintered MgO. FIG. 16 indicates that the MgO crystal grain size is increased by adding $MgF_2$ at sintering temperatures of 900° C. or higher, but the crystal growth of MgO is rather inhibited by adding $MgF_2$ at temperatures below 900° C.

SUMMARY OF THE INVENTION

Conventional art makes no mention of the useful contribution of fluorine to a MgO insulating layer included in a magnetic tunnel junction device. For example, the magnetoresistance ratio of the device of Mitani et al. including an insulating layer of a MgO/$MgF_2$ layered structure is less than 1% at room temperature, which is significantly lower than that of an ordinary magnetic tunnel junction device. In the MgOF insulating layer of Kwon et al. obtained by oxidizing a magnesium metal layer in a fluorine-containing oxidative atmosphere, no effect of fluorine on the increase in the barrier height of the insulating layer was observed. That is, an improvement in the electrical quality of a MgO insulating layer by fluorine has not been achieved so far.

In a magnetic tunnel junction device including a MgO layer as an insulating layer, the crystalline state of ferromagnetic layers and the MgO layer has a great influence on the magnetoresistance properties of the device. In order to obtain excellent magnetoresistance properties, it is important that both the ferromagnetic layers and the MgO layer are in a good crystalline state. In the magnetic tunnel junction device, the ferromagnetic layers and the MgO layer are both thin films. Such thin films are formed by sputtering, for example. However, it is difficult to stack metal thin films and an oxide thin film in layers in a good crystalline state, and crystal defects are likely to occur particularly in the MgO layer. In a known example of the formation of a metal thin film, an amorphous thin film is first formed and then crystallized to obtain a good crystalline state. However, crystal defects are likely to occur in the MgO layer not only when a crystallized film is directly formed but also when an amorphous film is formed and then crystallized. In order to obtain excellent magnetoresistance properties, it is important to minimize such crystal defects.

The present inventors have achieved a magnetic tunnel junction device exhibiting excellent magnetoresistance properties by using fluorine-added MgO as an insulating layer and specifying the amount of fluorine added (fluorine content). The magnetic tunnel junction device of the present invention includes: a first ferromagnetic layer; a second ferromagnetic layer; and an insulating layer formed between the first ferromagnetic layer and the second ferromagnetic layer. In this device, the insulating layer is composed of fluorine-added MgO, and a fluorine content in the insulating layer is 0.00487 at. % or more and 0.15080 at. % or less.

According to the present invention, a magnetic tunnel junction device including a MgO insulating layer and exhibiting excellent megnetoresistance properties can be obtained. It is believed that this effect is brought by the suppression of the formation of crystal defects in the insulating layer composed of MgO containing a specific amount of fluorine.

DETAILED DESCRIPTION OF THE INVENTION

Hereinafter, embodiments of the present invention will be described with reference to the drawings.

Figure 1:
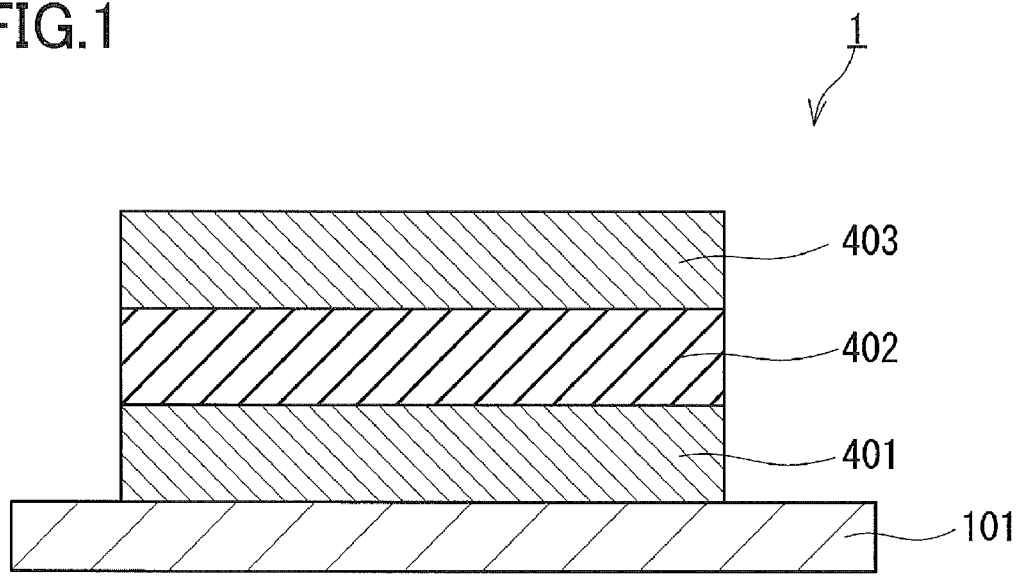
FIG. 1 is a cross-sectional view schematically showing an example of a magnetic tunnel junction device of the present invention.

FIG. 1 shows an example of a magnetic tunnel junction device of the present invention. A magnetic tunnel junction device 1 shown in FIG. 1 includes a substrate 101, a first ferromagnetic layer 401 formed on the substrate 101, an insulating layer 402 formed on the first ferromagnetic layer 401, and a second ferromagnetic layer 403 formed on the insulating layer 402. The insulating layer 402 is disposed between the first ferromagnetic layer 401 and the second ferromagnetic layer 403. The first ferromagnetic layer 401 and the second ferromagnetic layer 403 are composed of a ferromagnetic material. In the magnetic tunnel junction device 1, an electrical resistance between the first ferromagnetic layer 401 and the second ferromagnetic layer 403 that sandwich the insulating layer 402 changes depending on the relationship between the magnetization directions of the first and second ferromagnetic layers 401 and 403. The change in the electrical resistance (magnetoresistance change) results from a change in tunneling current flowing through the insulating layer 402. This magnetoresistance change in the device 1 makes the device 1 applicable to memory devices, sensor devices, etc.

In the magnetic tunnel junction device 1, the surface roughness of a ferromagnetic layer that is formed before the insulating layer 402 is required to be smaller than the thickness of the insulating layer 402 so as to prevent an electrical short circuit between the first ferromagnetic layer 401 and the second ferromagnetic layer 403. In the example shown in FIG. 1, in the case where the first ferromagnetic layer 401, the insulating layer 402, and the second ferromagnetic layer 403 are formed in this order on the substrate 101, the ferromagnetic layer that is formed before the insulating layer 402 is the first ferromagnetic layer 401. Therefore, in this case, the surface roughness of the first ferromagnetic layer 401 is required to be smaller than the thickness of the insulating layer 402.

The substrate 101 is, for example, a silicon substrate, a quartz substrate, or a glass substrate. Preferably, the surface of the substrate 101 is smoothed by a technique such as mirror polishing (for a silicon substrate and a quartz substrate) or annealing (for a glass substrate). The silicon substrate may be a substrate having on its surface a thermally oxidized film formed by thermal oxidation after mirror polishing. The quartz substrate may be a fused quartz substrate.

The formation of the first ferromagnetic layer 401 on the substrate 101 having the smoothed surface reduces the roughness of the surface opposite to the substrate 101 side surface of the first ferromagnetic layer 401 thus formed, that is, the roughness of the surface on which the insulating layer 402 is to be formed.

The magnetic tunnel junction device 1 may have an electrode layer composed of an electrically conductive material between the substrate 101 and the first ferromagnetic layer 401. The electrode layer can be used to detect an electrical resistance value between the ferromagnetic layers 401 and 403 in the device 1. The device 1 configured as such can be produced by forming the electrode layer on the substrate 101 and forming the first ferromagnetic layer 401 on the electrode layer thus formed.

The substrate 101 composed of the material of the first ferromagnetic layer 401 and having a mirror-polished surface may be used. In this case, the substrate 101 and the first ferromagnetic layer 401 are composed of the same material.

Preferably, the first ferromagnetic layer 401 and the second ferromagnetic layer 403 have a bcc crystal structure. In this case, the magnetoresistance properties of the magnetic tunnel junction device of the present invention is further improved. Presumably, this is because the junction between the bcc structure of the ferromagnetic layer and the specific crystal plane of the MgO layer (the continuity of energy bands between the ferromagnetic layer having the bcc structure and the MgO layer) provides a particularly good spin filter effect. In the case where the insulating layer is a $MgF_2$ layer, the matching in crystal structure between the insulating layer and the ferromagnetic layer having the bcc structure is poor, and thus such a good spin filter effect cannot be obtained.

Preferably, the ferromagnetic material of the first ferromagnetic layer 401 and the second ferromagnetic material 403 contains iron (Fe). Fe has a bcc crystal structure. The first ferromagnetic layer 401 and the second ferromagnetic layer 403 are each, for example, a Fe layer or a Fe-containing alloy layer. An alloy containing Fe is, for example, cobalt-iron-boron (Co—Fe—B). In an alloy containing cobalt (Co) that is more likely to maintain an amorphous structure and iron (Fe) having a bcc structure, the amorphous structure is obtained immediately after the formation of the alloy and the bcc structure is obtained after the crystallization thereof. Presumably, the junction between this bcc structure and the specific crystal plane of the MgO layer contributes to the particularly good spin filter effect.

It is preferable that at least one layer selected from the first ferromagnetic layer 401 and the second ferromagnetic layer 403 be composed of a Co—Fe—B alloy. More specifically, it is preferable that the first ferromagnetic layer 401 be composed of a Co—Fe—B alloy represented by the formula $\{Co_{(1-x)}Fe_x\}_{0.8}B_{0.2}$, where x is a numerical value that satisfies $0.25 \leq x \leq 0.5$. It is preferable that the second ferromagnetic layer 403 be composed of a Co—Fe—B alloy represented by the formula $\{Co_{(1-y)}Fe_y\}_{0.8}B_{0.2}$, where y is a numerical value that satisfies $0.25 \leq y \leq 0.50$. Preferably, both the ferromagnetic layers 401 and 403 are composed of the Co—Fe—B alloys represented by the above formulae.

The first ferromagnetic layer 401 and the second ferromagnetic layer 403 may be composed of a ferromagnetic material having the same composition, or they may be composed of ferromagnetic materials having different compositions. The same applies to the case where both the ferromagnetic layers 401 and 403 are composed of the Co—Fe—B alloys represented by the above formulae.

In order to obtain a magnetoresistance change in the magnetic tunnel junction device 1, the response of the magnetization rotation to an external magnetic field must be different between the first ferromagnetic layer 401 and the second ferromagnetic layer 403. In other words, one of the ferromagnetic layers must be a layer (free layer) whose magnetization direction is relatively easy to change with the change of the external magnetic field, and the other ferromagnetic layer must be a layer (pinned layer) whose magnetization direction is relatively difficult to change with the change of the external magnetic field. The magnetic tunnel junction device 1 can have such properties by employing a configuration similar to that of a known magnetic tunnel junction device.

Specific examples of the configuration are given below: a configuration in which materials with different crystal magnetic anisotropies are used for the first ferromagnetic layer and the second ferromagnetic layer; a configuration in which the first ferromagnetic layer and the second ferromagnetic layer with different shapes are used to provide a difference in their shape magnetic anisotropies; a configuration in which an antiferromagnetic layer is disposed in contact with one of ferromagnetic layers to induce unidirectional anisotropy at the interface between the ferromagnetic layer and the antiferromagnetic layer by heat treatment in a magnetic field (to cause the ferromagnetic layer in contact with the antiferromagnetic layer to function as a pinned layer); and a configuration in which one of the ferromagnetic layers is divided into two ferromagnetic films by a non-magnetic metal layer to magnetically couple these ferromagnetic films by exchange coupling or magnetostatic coupling. In the case where the ferromagnetic layer is divided into two ferromagnetic films by a non-magnetic metal layer, one of the films of this ferromagnetic layer in contact with the insulating layer is preferably a film containing Fe, such as a Fe film or a Fe-containing alloy film. More preferably, this film is a film composed of the Co—Fe—B alloy represented by either of the above formulae. The other film of this ferromagnetic layer not in contact with the insulating layer can have a wider range of compositions.

The insulating layer 402 is composed of fluorine-added MgO. The amount of fluorine added to the insulating layer 402 (hereinafter referred to as a "fluorine content") is 0.00487 at. % (atomic %) or more and 0.15080 at. % or less. Preferably, the fluorine content in the insulating layer 402 is 0.00487 at. % or more and 0.05256 at. % or less.

The insulating layer 402 isolates the first ferromagnetic layer 401 and the second ferromagnetic layer 403 electrically from each other but allows only tunneling current to flow therethrough. The insulating layer 402 must cause the tunneling current to change significantly enough to allow a magnetoresistance change in the magnetic tunnel junction device 1 to be detected. From these viewpoints, the insulating layer 402 has a thickness of several angstroms (Å) to several nanometers (nm). This thickness is similar to that of an insulating layer (MgO layer) in a conventional magnetic tunnel junction device.

The structure of the magnetic tunnel junction device of the present invention is not limited to the example shown in FIG. 1 as long as the effects of the present invention can be obtained. The magnetic tunnel junction device of the present invention may have, for example, a layer other than the substrate 101, the first ferromagnetic layer 401, the insulating layer 402, and the second ferromagnetic layer 403, as long as the effects of the present invention can be obtained.

The method for forming the constituent layers of the magnetic tunnel junction device of the present invention is not particularly limited. For example, a known thin film formation technique can be applied to the formation of these layers. The thin film formation technique is, for example, sputtering.

EXAMPLES

Hereinafter, the present invention will be described in more detail by way of Examples. The present invention is not limited to the following Examples.

(Structure of Device)

Figure 2:
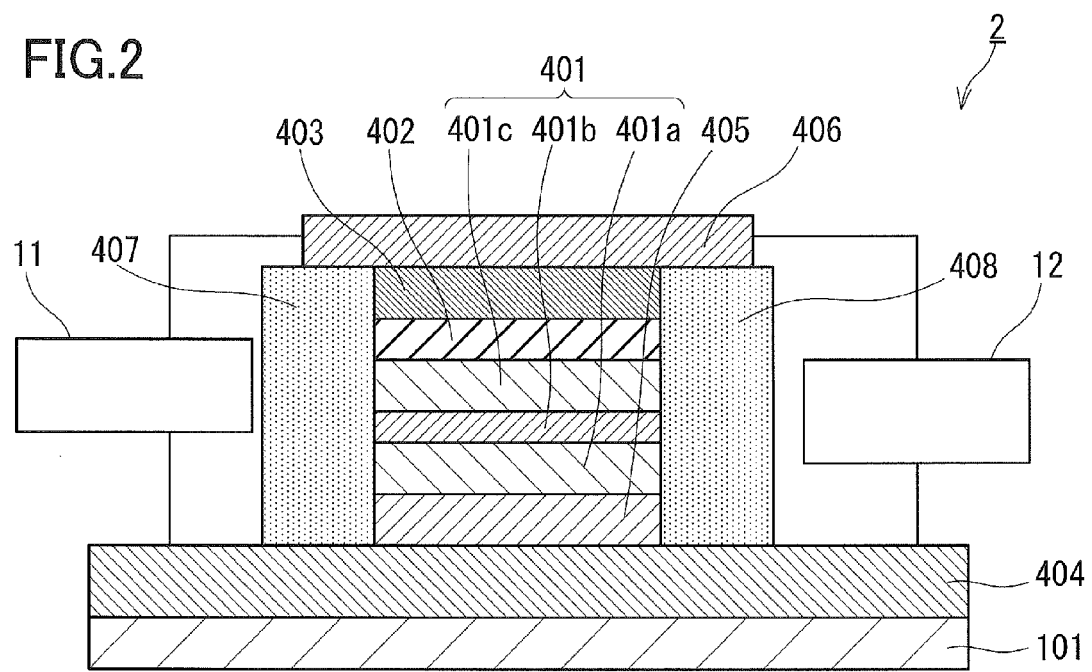
FIG. 2 is a cross-sectional view schematically showing a structure of a magnetic tunnel junction device of the present invention fabricated in Examples and a mechanism for measuring the magnetoresistance of the device.

FIG. 2 shows the structure of a magnetic tunnel junction device 2 of the present invention fabricated in Examples. FIG. 2 further shows a digital volt meter 11 and a constant current source 12 as a system for measuring the electrical resistance value (magnetoresistance) of the device 2.

The magnetic tunnel junction device 2 includes a substrate 101, a wiring electrode 404 formed on the substrate 101, an antiferromagnetic layer 405 formed on the wiring electrode 404, a first ferromagnetic layer 401 formed on the antiferromagnetic layer 405, an insulating layer 402 formed on the first ferromagnetic layer 401, a second ferromagnetic layer 403 formed on the insulating layer 402, and a wiring electrode 406 formed on the second ferromagnetic layer 403. The wiring electrode 404 is composed of a multilayer metal film of Ta film/Cu film/Ta film. The wiring electrode 406 is composed of a multilayer metal film of Ta film/Pt film/Ta film/Cu film/Ta film/Pt film. The antiferromagnetic layer 405 is composed of PtMn, which is an antiferromagnetic material. The first ferromagnetic layer 401 is composed of a multilayer metal film of $Co_{90}Fe_{10}$ film 401a/Ru film 401b/$Co_{40}Fe_{40}B_{20}$ film 401c. The Ru film 401b is a non-magnetic metal film. The antiferromagnetic layer 405 is disposed and the first ferromagnetic layer 401 in contact with this antiferromagnetic layer is composed of the above-mentioned multilayer metal film, and thereby the first ferromagnetic layer 401 is caused to function as a pinned layer whose magnetization direction is not changed relative to an external magnetic field. Interlayer insulating films 407 and 408 are disposed on the lateral surface of the antiferromagnetic layer 405, the first ferromagnetic layer 401, the insulating layer 402, and the second ferromagnetic layer 403.

The digital volt meter 11 and the constant current source 12 are each connected electrically to the wiring electrodes 404 and 406 that sandwich the multilayer structure of the first ferromagnetic layer 401/the insulating layer 402/the second ferromagnetic layer 403. The magnetoresistance of the device 2 is evaluated by measuring, by the digital volt meter 11, a potential difference generated in the above multilayer structure when an electric current is applied to the multilayer structure by the constant current source 12.

(Fabrication Method of Device)

The magnetic tunnel junction device 2 was fabricated in the following manner.

[Substrate 101]

The substrate 101 was prepared according to the following procedure.

A 4-inch diameter ($\phi$) Si substrate with a 100-nm-thick thermally oxidized film formed on its surface was split into pieces of 27 mm×28 mm in size. Next, each of the split substrates was subjected to, in a clean room, ultrasonic cleaning in pure water and ultraviolet (UV) ozone cleaning. Dust generated through the splitting (dust originating from the substrate) is removed by ultrasonic cleaning. Organic substances adhering to the substrate are removed by UV ozone cleaning. Ultrasonic cleaning and UV ozone cleaning were repeated twice or more. Less uneven cleaning can be achieved by repeating the cleaning twice or more.

[Wiring Electrode 404, Antiferromagnetic Layer 405, and First Ferromagnetic Layer 401]

Next, a Ta/Cu/Ta/PtMn/$Co_{90}Fe_{10}$/Ru/$Co_{40}Fe_{40}B_{20}$ multilayer metal film, as the wiring electrode 404/the antiferromagnetic layer 405/the first ferromagnetic layer 401, was formed on the substrate 101 by the following procedure.

First, the surface of the substrate 101 was subjected to reverse sputtering. Thereby, impurities adhering to the surface of the substrate 101 are removed, and the adhesion between the substrate 101 and the multilayer metal film formed on the substrate 101 is increased. The substrate 101 was set in a chamber of four-target magnetron sputtering apparatus (manufactured by Hirano Koh-on Co., Ltd.), and the chamber was evacuated to a vacuum of $5\times10^{-7}$ Torr or less. Next, Ar gas as a working gas was introduced into the chamber at a flow rate of 60 ccm to maintain the inside of the chamber in an Ar atmosphere at a pressure of 10 mTorr. In this state, the substrate 101 was subjected to reverse sputtering for 5 minutes by applying an RF power (30 W) to the substrate 101. In this case, positive Ar ions generated in the chamber collide with the surface of the substrate 101, which causes the surface of the substrate 101 to be reverse-sputtered.

Next, a multilayer metal film was formed on the reverse-sputtered surface of the substrate 101 using a four-target magnetron sputtering apparatus (manufactured by Hirano Koh-on Co., Ltd.) and a nine-target helicon magnetron sputtering apparatus (manufactured by ULVAC).

First, a Ta film (5 nm thick), a Cu film (200 nm thick), and a Ta film (5 nm thick) were formed in this order on the substrate 101 using the four-target magnetron sputtering apparatus to form the wiring electrode 404. The formation of Ta films were performed under the conditions of an Ar atmosphere at a pressure of 4 mTorr, a Ta metal target, and an RF power of 100 W applied to the target. The formation of Cu film was performed under the conditions of an Ar atmosphere at a pressure of 2 mTorr, a Cu metal target, and a DC voltage of 425 V applied to the target with a target current of 0.21 A.

Next, the substrate 101 with the Ta/Cu/Ta wiring electrode 404 formed thereon was once taken out of the chamber of the four-target magnetron sputtering apparatus into the atmosphere, and then set in the chamber of the nine-target helicon magnetron sputtering apparatus.

Next, the Ta film, which was the top layer of the wiring electrode 404, was etched by electron cyclotron resonance (ECR) cleaning to reduce the thickness by 2 nm. The ECR cleaning was performed under the following conditions. The flow rate of Ar gas was 2 ccm to generate Ar ions. A microwave power of 300 W was applied (the output current of a microwave detector was 150 μA) to excite Ar into a plasma state. A voltage for extracting and accelerating Ar ions was 100 V, and a voltage for controlling the diffusion of Ar ions was 500 V.

Next, on the Ta film which was the top layer, a Ta film (5 nm thick) was further formed as the wiring electrode 404, and then a PtMn film (30 nm thick) as the antiferromagnetic layer 405 and a $Co_{90}Fe_{10}$ (3 nm thick)/Ru (0.7 nm thick)/ $Co_{40}Fe_{40}B_{20}$ (3.1 nm thick) multilayer metal film as the first ferromagnetic layer 401 were formed in this order.

These films were deposited under the following conditions.

Ta film: an Ar atmosphere at a pressure of 0.8 Pa, a Ta metal target, an RF coil power of 5 W, and an RF cathode power of 65 W;

PtMn film: an Ar atmosphere at a pressure of 1.01 Pa, a PtMn target, and a DC cathode voltage of 450V;

$Co_{90}Fe_{10}$ film: an Ar atmosphere at a pressure of 0.8 Pa, a $Co_{90}Fe_{10}$ target, and a DC cathode voltage of 400V;

Ru film: an Ar atmosphere at a pressure of 0.8 Pa, and a DC cathode voltage of 380 V; and $Co_{40}Fe_{40}B_{20}$ film: an Ar atmosphere at a pressure of 0.8 Pa, a $Co_{40}Fe_{40}B_{20}$ target, an RF coil power of 50 W, and a DC cathode voltage of 400 V.

[Insulating Layer 402]

Next, the insulating layer 402 was formed on the $Co_{40}Fe_{40}B_{20}$ film in the chamber used to form this $Co_{40}Fe_{40}B_{20}$ film. The formation of the MgO insulating layer (tunnel barrier) 402 with a controlled fluorine content is described below with reference to FIG. 3.

Figure 3:
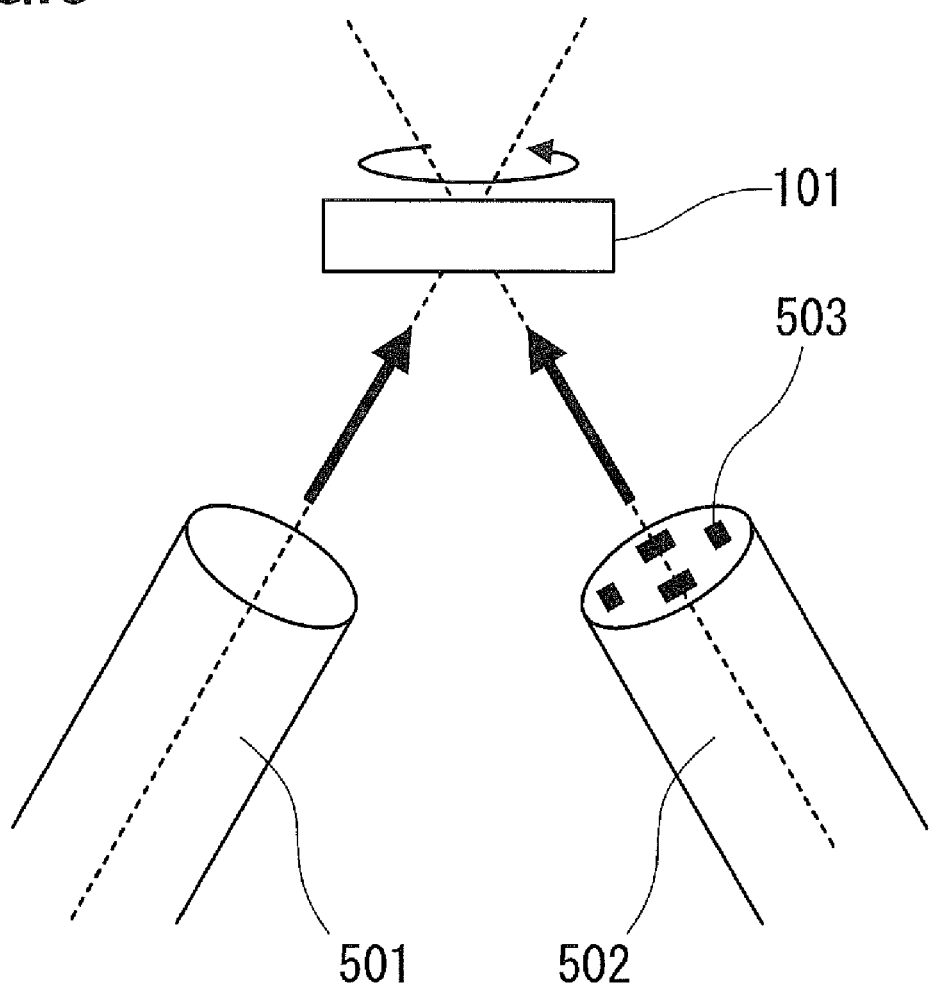
FIG. 3 is a schematic diagram for explaining a method of forming an insulating layer in the magnetic tunnel junction device of the present invention fabricated in Examples.

As shown in FIG. 3, the insulating layer 402 was formed using two types of sputtering cathodes 501 and 502. The sputtering cathodes 501 and 502 were placed obliquely so that their axis lines intersect with each other in the same vacuum chamber. The substrate 101 was placed at the point of intersection of the axis lines of these sputtering cathodes 501 and 502. Dotted lines in FIG. 3 indicate the axis lines of the sputtering cathodes 501 and 502. A pure MgO target was used as one sputtering cathode 501. A pure MgO target on which $MgF_2$ chips 503 were attached was used as the other sputtering cathode 502. Hereinafter, this target with the $MgF_2$ chips 503 attached thereto is referred to as an "on-chip target".

The substrate 101 was placed in this manner, and then co-sputtering was performed using these sputtering cathodes 501 and 502. Thus, the insulating layer 402 was formed. The uniformity of the surface of the insulating layer 402 was enhanced by rotating the substrate 101 during the formation of the insulating layer 402.

As the pure MgO target, a single crystal target with a purity of 3N (99.9%) (manufactured by Tateho Chemical Industries Co., Ltd., 2 inches in diameter ϕ) was used. As the on-chip target, a target in which three $MgF_2$ chips with a purity of 4N (99.99%) (manufactured by Kojundo Chemical Laboratory Co., Ltd., 5 mm×5 mm×2 mm in thickness) were attached to a sintered target with a purity of 4N (99.99%) (manufactured by Kojundo Chemical Laboratory Co., Ltd., 2 inches in diameter ϕ) was used.

The conditions for forming the insulating layer 402 were an RF coil power of 50 W, an RF cathode power of 0 to 150 W, and an Ar atmosphere at a pressure of 4.05 Pa. The fluorine content in the insulating layer 402 was controlled by varying the power applied to the on-chip target in the range of 0 W to 50 W aw well as the power applied to the pure MgO target in the range of 0 W to 150 W (see Table 2).

Before the insulating layer 402 was formed, the relationship (i.e., the sputtering rate) of the film thickness to the power applied to each sputtering cathode and the sputtering time was evaluated to control the thickness of the insulating layer 402 to be formed. This evaluation was performed by preliminary deposition tests using the sputtering cathodes 501 and 502 separately. When the insulating layer 402 was actually formed, the sputtering time (deposition time) was determined, in consideration of the sputtering rate determined for each sputtering cathode, to obtain the insulating layer 402 with a desired thickness. In the present examples, the insulating layer 402 with a thickness of 2.0 nm was formed.

[Second Ferromagnetic Layer 403 and Wiring Electrode 406]

Next, the second ferromagnetic layer 403 (a 5-nm-thick $Co_{40}Fe_{40}B_{20}$ film) and a 5-nm-thick Ta film as a part of the wiring electrode 406 were formed in this order on the insulating layer 402 in the chamber used to form the insulating layer 402.

The second ferromagnetic layer 403 was formed under the deposition conditions for the $Co_{40}Fe_{40}B_{20}$ film of the first ferromagnetic layer 401. The Ta film was formed under the conditions of an Ar gas atmosphere at a pressure of 0.8 Pa, an RF coil power of 5 W, and an RF cathode power of 65 W.

Next, after the Ta film was formed, the substrate 101 was again set in a four-target magnetron sputtering apparatus, and the Ta film which was the top layer was reverse-sputtered to reduce the thickness by 2 nm. Then, on the Ta film, a 5-nm-thick Ta film and a 50-nm-thick Pt film were formed in this order as a part of the wiring electrode 406. Reverse sputtering was performed in the same manner as that for the substrate 101 described above, except that an RF power of 40 W was applied. The Pt film was formed under the conditions of an Ar atmosphere at a pressure of 6 mTorr and an applied RF power of 100 W.

Figure 4A:
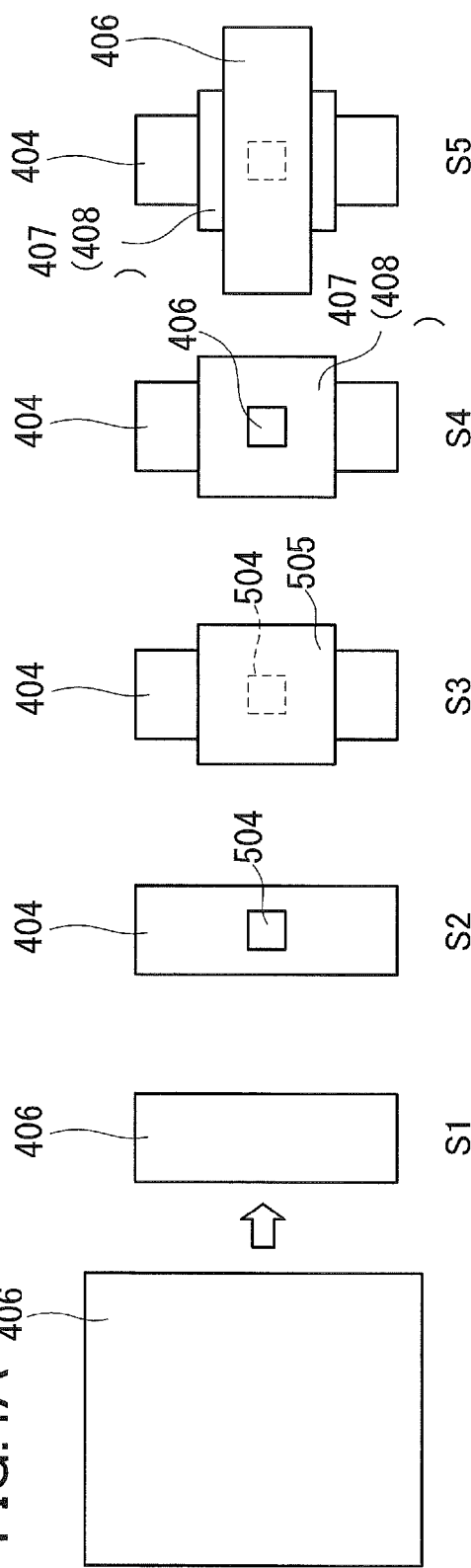
FIG. 4A is a process diagram for explaining microfabrication steps in the fabrication of the magnetic tunnel junction device of the present invention in Examples.
Figure 4B:
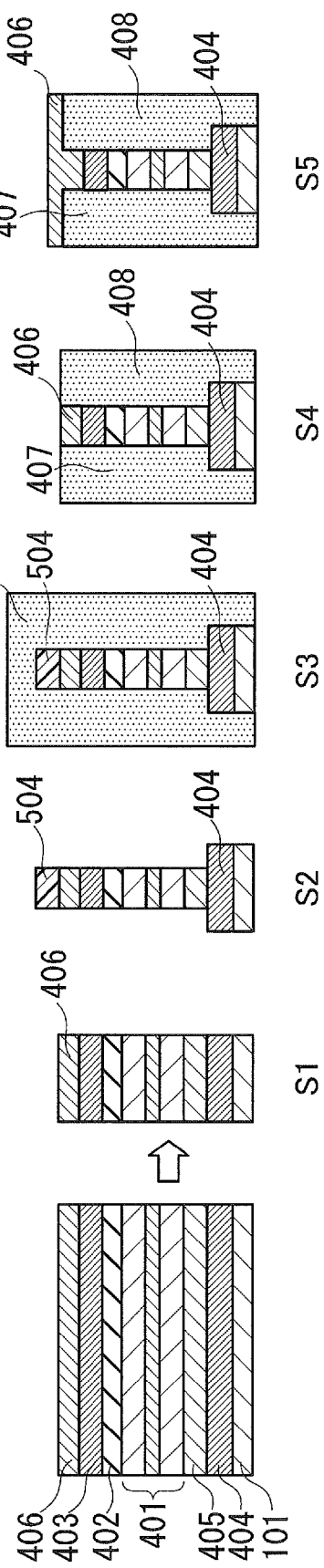
FIG. 4B is a process diagram illustrating the steps shown in FIG. 4A, with the cross sections of the device.

Next, the multilayer film thus fabricated was subjected to microfabrication using photolithography and Ar ion milling techniques. Thus, a mesa device was obtained. FIG. 4A shows the steps (S1 to S5) of the microfabrication with the top views of the multilayer film, and FIG. 4B shows the steps (S1 to S5) of the microfabrication with the cross sections of the multilayer film.

First, the multilayer film thus fabricated was divided by photolithography and Ar ion milling (S1). Next, a resist resin 504 (S1813, manufactured by Rohm and Haas) having a shape for forming the mesa shape was placed on the Pt film (the wiring electrode 406) which was the top layer of each of the divided multilayer films. Then, the resist resin 504 was etched by photolithography and Ar ion milling until the wiring electrode 404 was exposed. Thus, the multilayer film was microfabricated into a junction mesa shape (S2). A Canon aligner (PLA-501F) was used to pattern the resist resin 504. Next, an interlayer insulating film 505 (250-nm-thick $SiO_2$) was deposited by sputtering on the entire multilayer film, with the resist resin 504 being left as it is (S3). Next, the interlayer insulating film 505 including the resist resin 504 on the junction mesa was lifted off to form the interlayer insulating films 407 and 408 and expose the Pt film (the wiring electrode 406) (S4). After the lift-off, the multilayer film was again set in the four-target magnetron sputtering apparatus, and a Ta film (5 nm thick), a Cu film (200 nm thick), a Ta film (5 nm thick), and a Pt film (50 nm thick) were formed in this order on the Pt film which was the top layer. Next, these films thus formed were subjected to microfabrication by photolithography and Ar ion milling. Thus, the wiring electrode 406 connected electrically to the second ferromagnetic layer 403 was completed (S5). The Ta films, the Cu film, and the Pt film were formed under the above deposition conditions.

(Evaluation Method of Fluorine Content in Insulating Layer)

Another insulating layer 402 was formed using the same technique as for the fabrication of the above magnetic tunnel junction device 2, and the relationship between the deposition conditions for forming the insulating layer 402 and the amount of fluorine added to that insulating layer was evaluated.

First, an insulating layer 402 (50 nm thick) was formed for evaluation by co-sputtering, as shown in FIG. 3, using the pure MgO target and the on-chip target. After a $Co_{40}Fe_{40}B_{20}$ film (3 nm thick) as a base layer was formed on a Si substrate similar to that used for the fabrication of the device 2, the insulating layer 402 was formed thereon. The insulating layer 402 was protected from exposure to the atmosphere by further forming a protective layer (a 3-nm-thick $Co_{40}Fe_{40}B_{20}$ film) thereon.

The fluorine content in the insulating layer 402 thus formed was evaluated by SIMS (Secondary Ion Mass Spectrometry) combined with ion milling. Ion milling was used to evaluate the change in the fluorine content in the thickness direction of the insulating layer 402. The fluorine content measured by SIMS was quantified based on the measured value of a standard sample. The standard sample was obtained by forming a MgO film on a Si substrate similar to that used for the fabrication of the device 2 and implanting $10^{20}$/cc fluorine into the MgO film by ion implantation.

The fluorine content (at. %) in the insulating layer 402 was obtained by converting the measured fluorine content obtained by the SIMS measurement into the number of atoms per cubic centimeter (cc) using the measured content in the standard sample and then calculating the ratio of the number of atoms per cc of fluorine to that of MgO from the specific gravity and formula weight of MgO. Specifically, from the specific gravity 3.6 and the formula weight 40.304 of MgO, the number of magnesium (Mg) atoms and the number of oxygen (O) atoms per cubic centimeter of MgO are each calculated to be 3.6/40.304×Avogadro's number=about $0.538 \times 10^{23}$. Thus, the ratio of the number of fluorine atoms to the sum of the number of Mg atoms and the number of O atoms, i.e., $1.076 \times 10^{23}$, was determined as the amount of fluorine (at. %) added to MgO.

Five types of insulating layers were prepared for evaluation. Specifically, the prepared insulating layers were: three types (a fluorine-added sample 1, a fluorine-added sample 2, and a fluorine-added sample 3), each of which was a fluorine-added MgO film formed by supplying electric power to both the pure MgO target and the on-chip target (the $MgF_2$/MgO target); and two types (a reference sample 1 and a reference sample 2), each of which was a fluorine-free MgO film formed without supplying electric power to the on-chip target. Electric powers applied to the targets were 50 W/0 W for the fluorine-added sample 1, 50 W/150 W for the fluorine-added sample 2, 5 W/150 W for the fluorine-added sample 3, 0 W/150 W for the reference sample 1, and 0 W/150 W for the reference sample 2, respectively, when expressed in "the electric power applied to the on-chip target to the electric power supplied to the pure MgO target".

Figure 5:
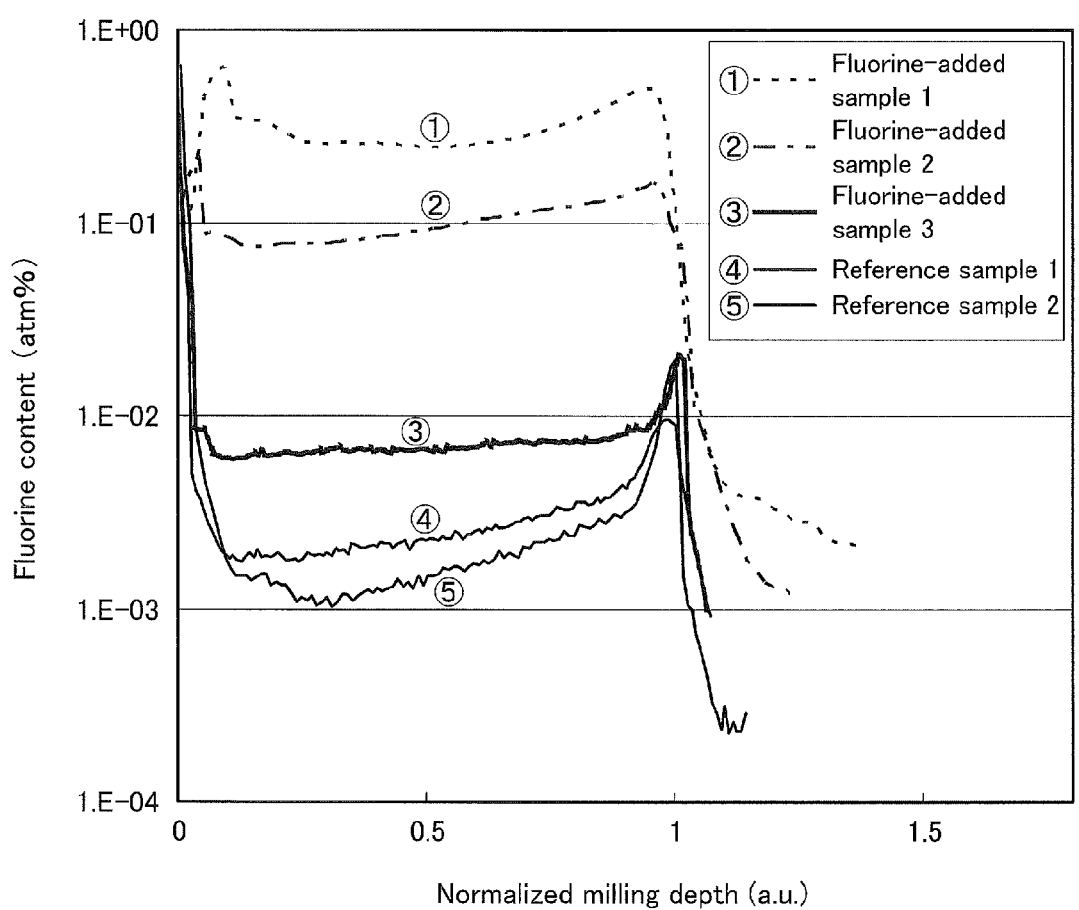
FIG. 5 is a diagram showing the relationship between the deposition conditions for insulating layers and the fluorine amounts added to the insulating layers, evaluated in Examples.

FIG. 5 shows the evaluation results of the fluorine contents of these samples. In FIG. 5, the vertical axis represents the fluorine content (at. %) in each sample, and the horizontal axis represents the normalized milling depth (a.u.). FIG. 5 shows the change in the fluorine content in the thickness direction of each insulating layer. Here, the "normalized milling depth" means the milling depth relative to the thickness of the insulating layer to be evaluated, in which "0" represents the top of the insulating layer (the interface with the $Co_{40}Fe_{40}B_{20}$ film as a protective layer) and "1" represents the bottom of the insulating layer (the interface with the $Co_{40}Fe_{40}B_{20}$ film as a base layer), assuming that the insulating layer is milled at a constant rate with an increase in milling time. The bottom of the insulating layer was determined based on the judgment that the ion milling reached the bottom of the insulating layer (the $Co_{40}Fe_{40}B_{20}$ film as the base layer) at a milling time when a $^{18}O$ signal, which was measured simultaneously, dropped sharply.

In the present examples, a value obtained by averaging quantitative fluorine contents within the range of ±10% of the depth at the center of the insulating layer in its thickness direction (i.e., the normalized milling depth of 0.5) was determined as an actual measured fluorine content in each sample. Thereby, an area of the insulating layer corresponding to 40% of its thickness from each of the interfaces with the adjacent layers was excluded from the evaluation, and thus the influence of the interfaces on the obtained fluorine content was eliminated.

Table 1 shows the fluorine content of each sample. Table 1 also shows the BG-corrected value obtained by subtracting the average value of the reference samples 1 and 2 as a background (BG) from the actual measured value.

TABLE 1

| | Applied power (W) | | Fluorine content (at. %) | |
| --- | --- | --- | --- | --- |
| | Pure MgO target | $MgF_2$/MgO target | Actual measured value | BG-corrected value |
| Fluorine-added sample 1 | 0 | 50 | 0.25370 | 0.25182 |
| Fluorine-added sample 2 | 150 | 50 | 0.09247 | 0.09058 |
| Fluorine-added sample 3 | 150 | 5 | 0.00675 | 0.00487 |
| Reference sample 1 | 150 | 0 | 0.00147 | — |
| Reference sample 2 | 150 | 0 | 0.00229 | — |

Figure 6:
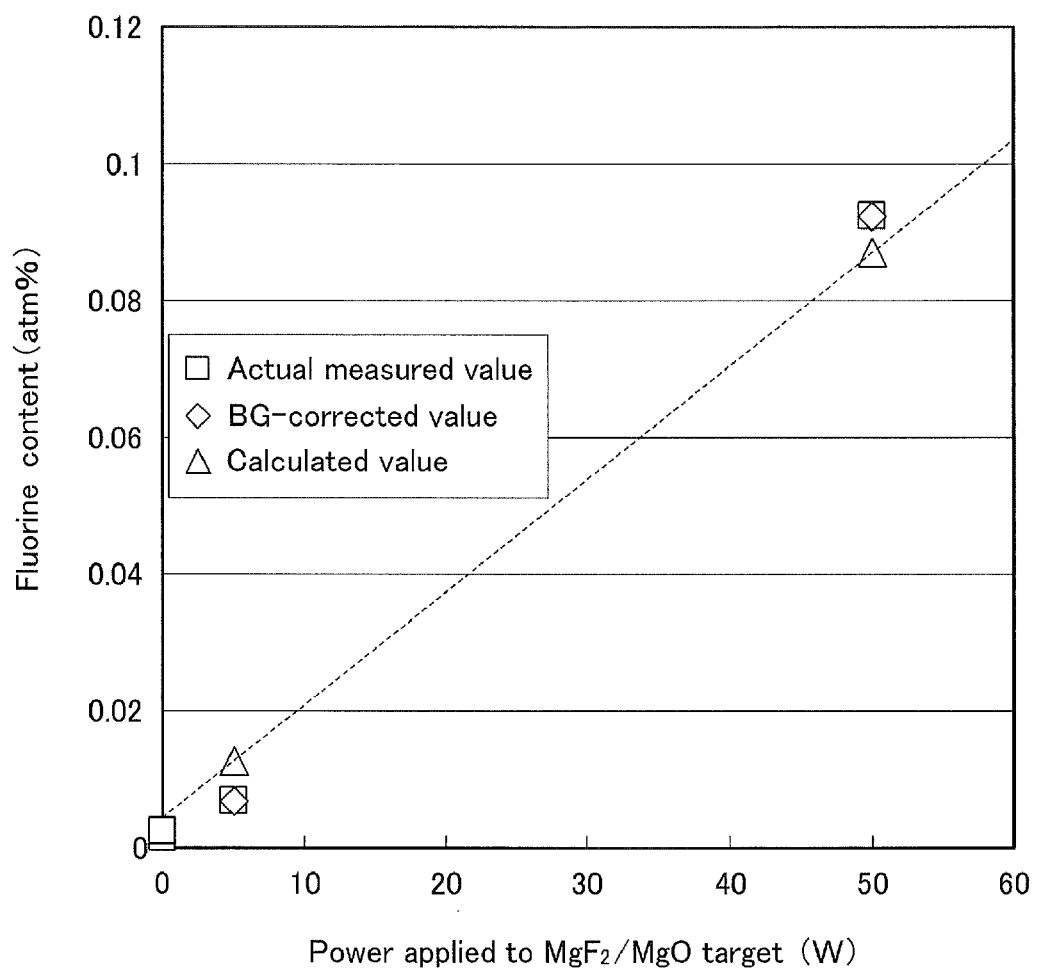
FIG. 6 is a diagram showing, for comparison, the actual measured values of fluorine contents and the calculated ones in the insulating layers, evaluated in Examples.

The insulating layer formed by co-sputtering can be regarded as a layer in which fluorine in fluorine-containing MgO originating from an on-chip target is diluted with MgO originating from a pure MgO target. The dilution ratio can be obtained from the electric powers applied to these targets (i.e., the deposition rates resulting from these targets). Hence, the fluorine contents of the fluorine-added samples 2 and 3 and the reference samples 1 and 2 were each calculated from the ratio of the deposition rates based on the BG-corrected value of the fluorine-added sample 1 formed by supplying electric power only to the on-chip target. FIG. 6 shows a comparison result between the fluorine contents thus calculated and the actual measured values by SIMS. In FIG. 6, the horizontal axis represents the electric power applied to the on-chip target, and the vertical axis represents the fluorine content in each sample. FIG. 6 shows that the BG-corrected value obtained by SIMS measurement was almost equal to the calculated value obtained using the deposition rates. That is, it was found that the fluorine content almost equal to the actual measured value obtained by SIMS can be calculated from the deposition rates.

Therefore, in the present examples, for insulating layers formed under deposition conditions for which actual measured contents by SIMS were corrected, BG-corrected values of the actual measured contents were determined to be the fluorine contents of these insulating layers. For insulating layer formed under deposition conditions for which actual measured contents by SIMS were not corrected, values calculated from the deposition rates (sputtering rates) were determined to be the fluorine contents of these insulating layers.

Table 2 below shows the fluorine contents of insulating layers formed under different deposition conditions and used for the evaluation of magnetoresistance properties described later. Table 2 also shows the deposition conditions (electric powers applied to pure MgO targets and on-chip targets) for these insulating layers.

TABLE 2

| Deposition conditions | Applied power (W) | | Fluorine content (at. %) | |
| --- | --- | --- | --- | --- |
| | Pure MgO target | MgF$_2$/MgO target | Calculated value | BG-corrected value |
| Reference conditions | 150 | 0 | 0.00000 | — |
| Conditions A | 150 | 5 | — | 0.00487 |
| Conditions B | 150 | 15 | 0.03441 | — |
| Conditions C | 150 | 25 | 0.05256 | — |
| Conditions D | 150 | 50 | — | 0.09058 |
| Conditions E | 53 | 50 | 0.15080 | — |
| Conditions F | 30 | 50 | 0.18259 | — |
| Conditions G | 0 | 50 | — | 0.25182 |

(Heat Treatment in Magnetic Field and Evaluation of Magnetoresistance Ratio)

Before the magnetoresistance ratio (MR ratio) of the magnetic tunnel junction device 2 fabricated as described above was evaluated, the device was subjected to heat treatment (magnetic field heat treatment) for 1 hour in a magnetic field of 5 kOe (oersted) in a vacuum at a pressure of $10^{-5}$ Pa to impart magnetic anisotropy to the antiferromagnetic layer 405 included in this device. Heat treatment was performed under the three temperature conditions: 280° C.; 300° C. to 305° C.; and 323° C. to 327° C.

Next, the heat-treated device was connected electrically to a digital voltmeter and a constant current source as shown in FIG. 2, and then an external magnetic field was swept from −500 Oe to 500 Oe in the same direction of the magnetic field applied during heat treatment. Thus, the change in the electrical resistance (magnetoresistance change) in the device in response to the application of the external magnetic field was evaluated.

Figure 7:
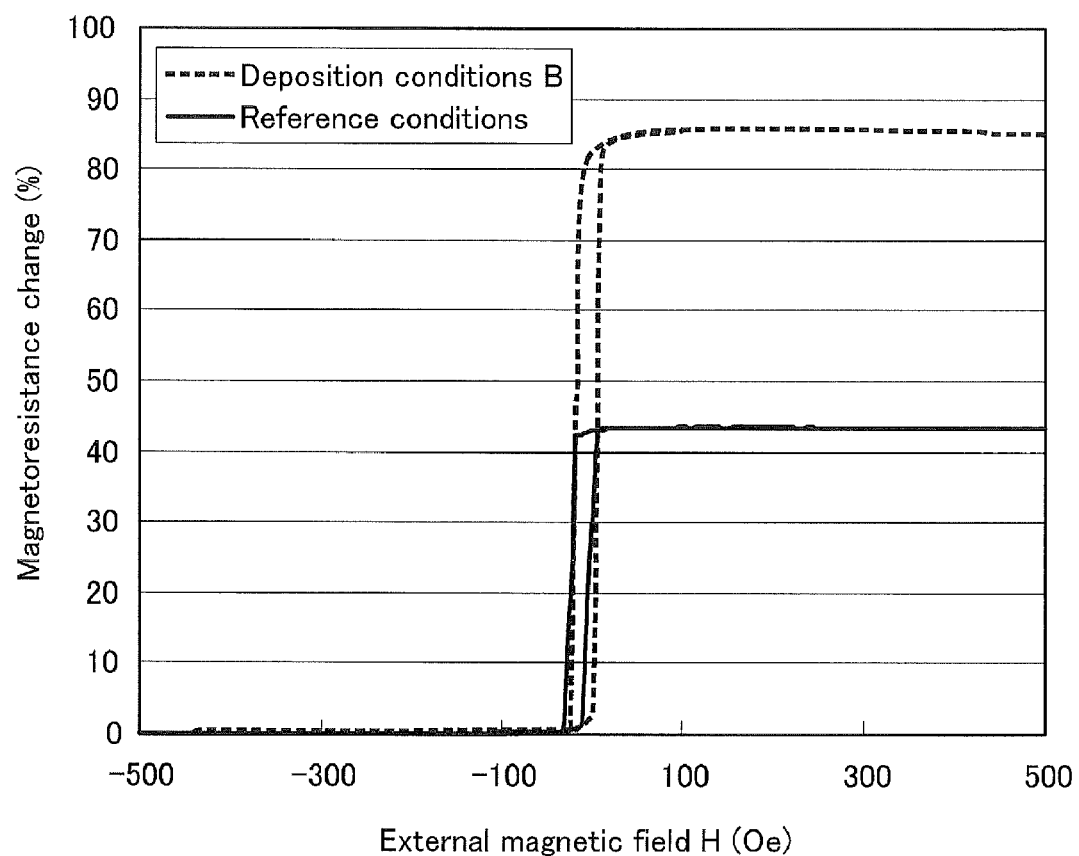
FIG. 7 is a diagram showing magnetoresistance (MR) changes of magnetic tunnel junction devices, evaluated in Examples.

Here, the magnetoresistance (MR) of a device in an external magnetic field H was obtained as follows. The minimum resistance $R_{min}$ of the device obtained by evaluation was subtracted from the resistance R obtained when the external magnetic field H was applied to the device to obtain a difference between them, and the absolute value of the difference was divided by the minimum resistance $R_{min}$. That is, a value represented by the formula $(R-R_{min})/R_{min} \times 100(\%)$ was determined as the magnetoresistance (MR) of the device. The voltage bias applied to the device 2 for the evaluation of its MR was 10 mV. FIG. 7 shows a change in the MR of each of devices in response to an external magnetic field applied thereto. One of the devices was fabricated under the reference conditions (with no fluorine added), and the other was fabricated under the deposition conditions B (with a fluorine content of 0.034 at. %), (both of which were subjected to heat treatment in a magnetic field at 302° C.). As shown in FIG. 7, the device fabricated under the deposition conditions B showed a greater change in the MR than the device fabricated under the reference conditions with no fluorine added.

Figure 8A:
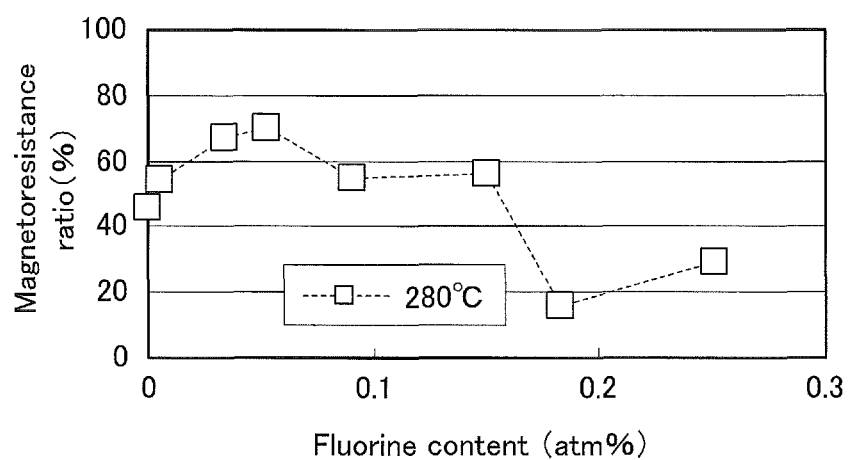
FIG. 8A is a diagram showing the relationship between the magnetoresistance ratios (MR ratios) of magnetic tunnel junction devices including insulating layers and the fluorine contents in the insulating layers, evaluated in Examples.
Figure 8B:
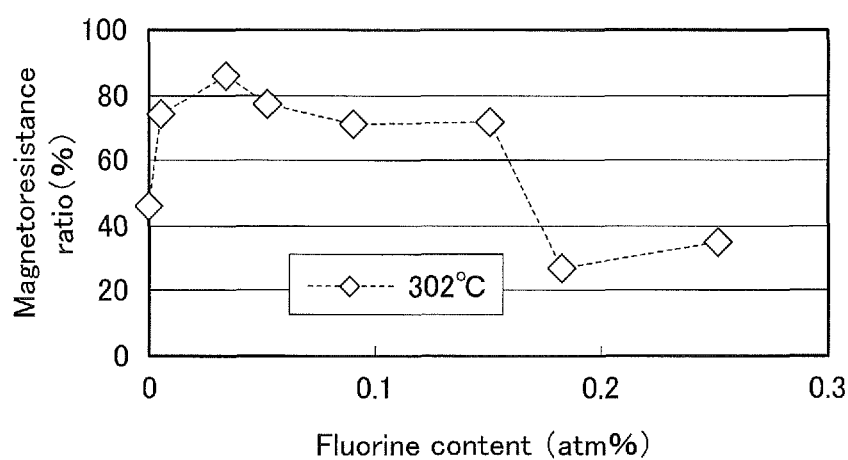
FIG. 8B is a diagram showing the relationship between the magnetoresistance ratios (MR ratios) of the magnetic tunnel junction devices including the insulating layers and the fluorine contents in the insulating layers, evaluated in Examples.
Figure 8C:
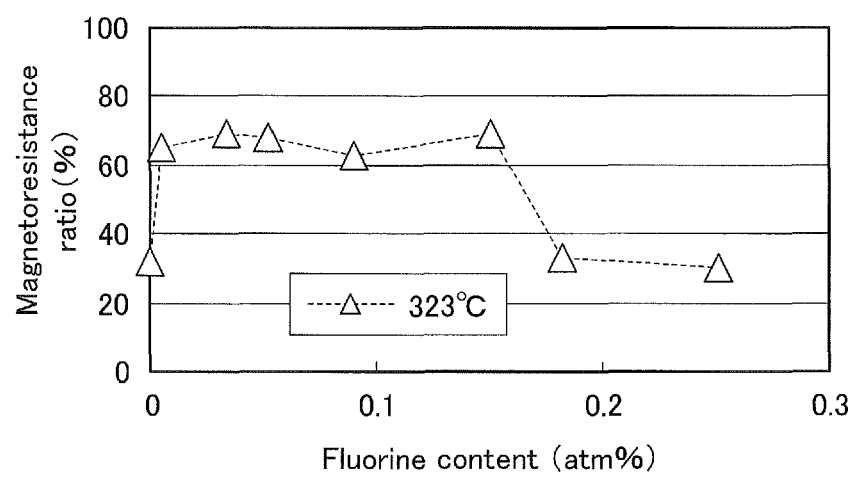
FIG. 8C is a diagram showing the relationship between the magnetoresistance ratios (MR ratios) of the magnetic tunnel junction devices including the insulating layers and the fluorine contents in the insulating layers, evaluated in Examples.
Figure 9:
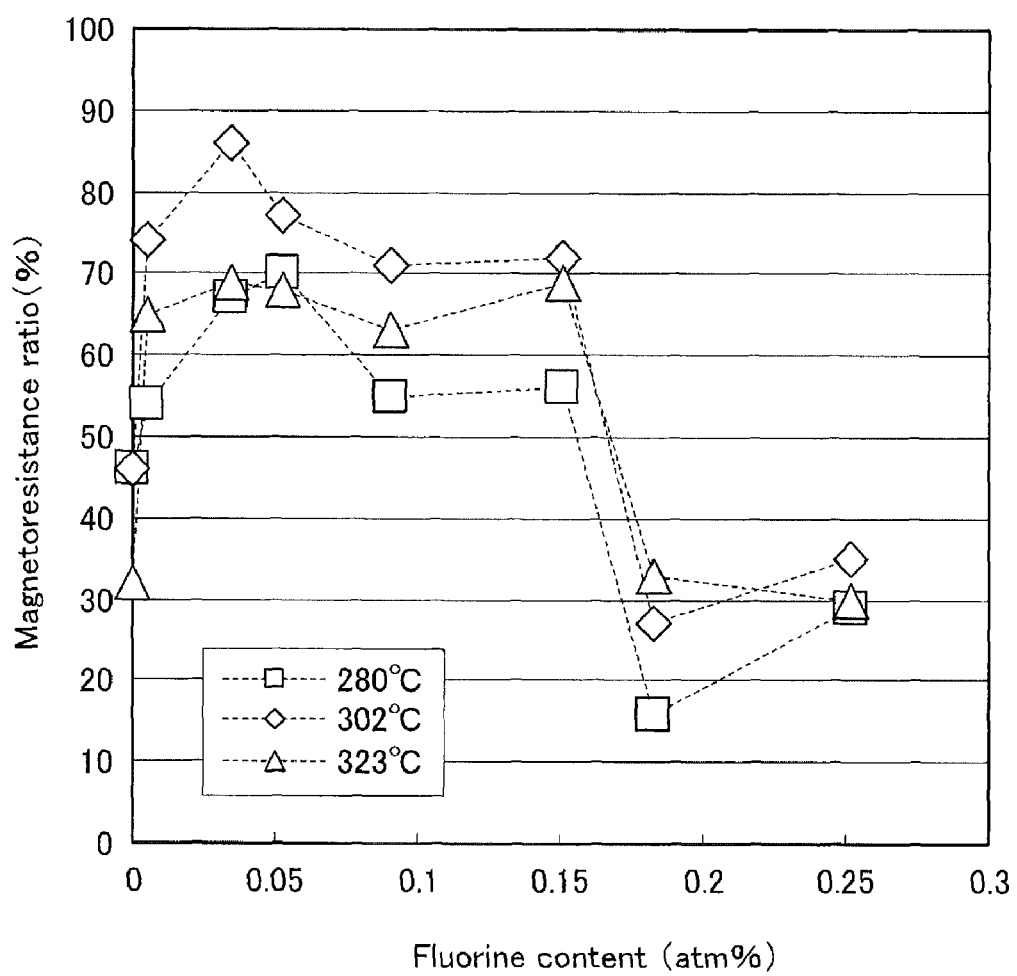
FIG. 9 is a diagram showing the relationship between the magnetoresistance ratios (MR ratios) of the magnetic tunnel junction devices including the insulating layers and the fluorine contents in the insulating layers, evaluated in Examples.

Separately from these devices, devices (a reference sample and MR samples A to G), in which insulating layers were formed under the respective deposition conditions shown in Table 2, were fabricated and their MRs were evaluated. FIG. 8A to FIG. 8C, FIG. 9, and Table 3 below show the evaluation results. The magnetoresistance ratios (MR ratios) shown in FIG. 8A to FIG. 8C, FIG. 9, and Table 3 are the maximum MR of the devices in response to the change in the applied external magnetic field. The MR ratios are represented by the formula $(R_{max}-R_{min})/R_{min} \times 100(\%)$ using the maximum resistances $R_{max}$ obtained by evaluation. FIG. 8A shows the results when the magnetic field heat treatment was performed at the temperature of 280° C. FIG. 8B shows the results when the magnetic field heat treatment was performed at the temperature of 302° C. FIG. 8C shows the results when the magnetic field heat treatment was performed at the temperature of 323° C. FIG. 9 shows the results shown in FIG. 8A to FIG. 8C collectively.

TABLE 3

| Sample name | Deposition conditions for insulating layer | Fluorine content (at. %) | Magnetoresistance ratio (%) | | |
| --- | --- | --- | --- | --- | --- |
| | | | Heat treatment at 280° C. | Heat treatment at 302° C. | Heat treatment at 323° C. |
| Reference sample | Reference conditions | 0.00000 | 46 | 46 | 32 |
| MR sample A | Conditions A | 0.00487 | 54 | 74 | 65 |
| MR sample B | Conditions B | 0.03441 | 67 | 86 | 69 |
| MR sample C | Conditions C | 0.05256 | 70 | 77 | 68 |
| MR sample D | Conditions D | 0.09058 | 55 | 71 | 63 |
| MR sample E | Conditions E | 0.15080 | 56 | 72 | 69 |
| MR sample F | Conditions F | 0.18259 | 16 | 27 | 33 |
| MR sample G | Conditions G | 0.25182 | 29 | 35 | 30 |

As shown in FIG. 8A to FIG. 8C, FIG. 9, and Table 3, the MR samples A to E having fluorine contents in insulating layers ranging from 0.00487 at. % to 0.15080 at. % showed improved MR ratios, compared to the reference sample having a fluorine content of zero. However, the MR samples F and G having fluorine contents of 0.18259 at. % or more in insulating layers showed rapidly reduced MR ratios, which were lower than the MR ratio of the reference sample. A comparison was made among the MR samples A to E having high MR ratios. As a result, the MR samples A to C having fluorine contents in insulating layers in the range of 0.00487 at. % or more and 0.05256 at. % or less were particularly excellent, regardless of the heat treatment temperature and, among these samples, the MR sample B having a fluorine content of 0.03441 at. % showed the highest MR ratio.

(Evaluation of Influence of Bias Voltage)

Figure 10:
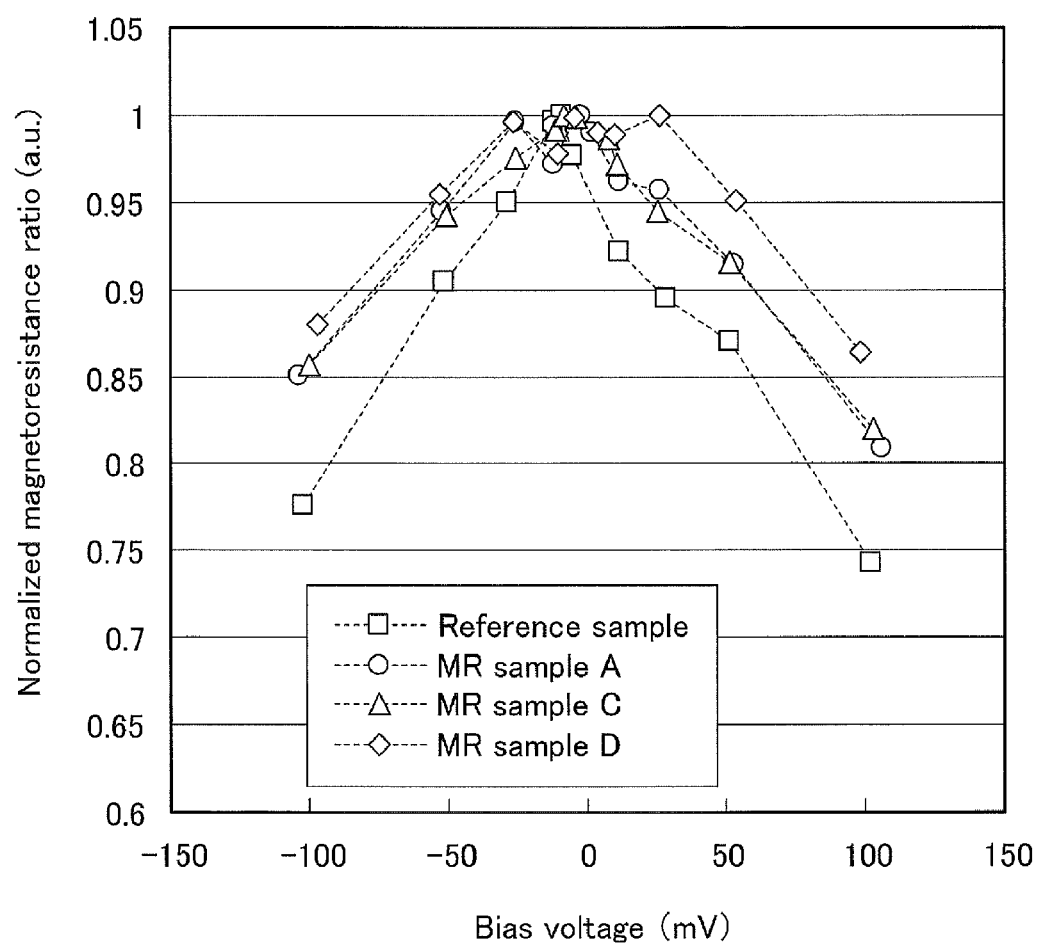
FIG. 10 is a diagram showing the relationship between bias voltages applied to the magnetic tunnel junction devices and the magnetoresistance ratios (MR ratios) of the devices, evaluated in Examples.

When a magnetic tunnel junction device is used as a sensor device, a bias voltage is applied to the device. Therefore, it is important to evaluate the magnetoresistance properties shown by the device when the applied bias voltage was varied. FIG. 10 shows changes in the MR ratio shown by the reference sample and the MR samples A, C and D when the applied bias voltage (measured bias voltage) was varied within a range of −100 mV to 100 mV. In FIG. 10, the vertical axis represents the normalized MR ratios shown by these devices when the applied bias voltage was varied, and the horizontal axis represents the bias voltage applied to the devices. The MR ratios of each device were normalized assuming that the maximum MR ratio, which was shown by the device when the applied bias voltage was varied, was 1. This normalization makes it easy to compare the influence of the bias voltage among the devices.

Normally, the MR ratio of a device tends to decrease as an applied bias voltage increases. However, as shown in FIG. 10, in the MR samples A, C and D having fluorine contents in the range of 0.00487 at. % or more and 0.15080 at. % or less, decreases in the MR ratio with an increase in the bias voltage were suppressed and their normalized MR ratios were improved, compared to the reference sample. This is believed to be because the barrier heights of the insulating layers were increased.

Also when a $Co_{20}Fe_{60}B_{20}$ film was used instead of a $Co_{40}Fe_{40}B_{20}$ film as the ferromagnetic film 401c and/or the ferromagnetic layer 403 in contact with the insulating layer, the same results were obtained. In view of the matching of the crystal structures of the insulating layer and the ferromagnetic layer in contact with the insulating layer (the matching between the (100) plane of the insulating layer and the bcc structure of the ferromagnetic layer), it was estimated that the same results could be obtained also when a Co—Fe—B alloy film represented by the formula $\{Co_{(1-x)}Fe_x\}_{0.8}B_{0.2}$, where x is a numerical value that satisfies $0.25 \leq x \leq 0.5$, was used as the ferromagnetic film 401c and/or the ferromagnetic layer 403.

Also, for devices other than these devices, that is, those having 2.6-nm-thick insulating layers with fluorine contents of 0.03441 at. % and 0.05256 at. % respectively, the same results were obtained. The MR ratios of these devices were comparable to those of the devices having 2.0-nm-thick insulating layers.

(Evaluation of Barrier Height for Tunneling Current in Insulating Layer)

J. H. Kwon et al., "Effect of F-inclusion in nm-thick MgO tunnel barrier", Current Applied Physics, vol. 9 (2009), pp. 788-791 does not disclose the amount of fluorine to be added to a modified MgO tunnel barrier. In addition, this document does not disclose the effect of modification of the MgO tunnel barrier on the magnetoresistance ratio of a magnetic tunnel junction device using this modified MgO tunnel barrier. Hence, in order to clarify the difference between the technology of Kwon et al. and the present invention, the barrier height of the insulating layer in the magnetic tunnel junction device of the present invention was evaluated by the following procedure.

Figure 11:
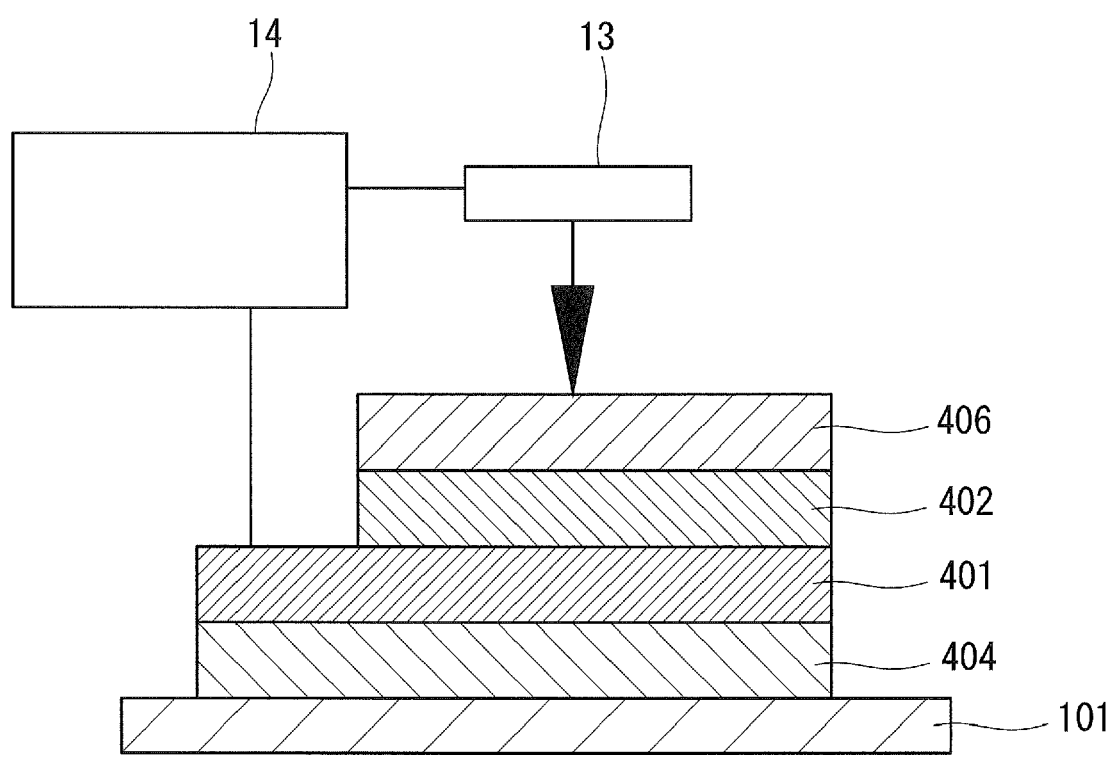
FIG. 11 is a schematic diagram showing a sample fabricated to evaluate the barrier height of an insulating layer and a method of evaluating the barrier height in Examples.

FIG. 11 is a schematic diagram showing a sample fabricated to evaluate the barrier height of an insulating layer and a method of evaluating the barrier height. As shown in FIG. 11, the sample for evaluation has a structure in which a wiring electrode 404, a first ferromagnetic layer 401, an insulating layer 402, and a wiring electrode 406 are formed in this order on a substrate 101. A fabrication method of the evaluation sample is described below.

First, a Ta/Cu/Ta multilayer metal film was formed as the wiring electrode 404 on the Si substrate 101 similar to the substrate used for fabricating the magnetic tunnel junction device 2. The thickness of each film and its formation method were the same as the thickness of each film in the wiring electrode 404 of the device 2 and its formation method. Next, a $Co_{40}Fe_{40}B_{20}$ film as the first ferromagnetic layer 401 was formed on the wiring electrode 404. The thickness of the first ferromagnetic layer and its formation method were the same as the thickness of the second ferromagnetic layer 403 in the device 2 and its formation method. Next, a 2.0-nm-thick fluorine-added MgO layer was formed on the first ferromagnetic layer 401 in the same manner as in the fabrication of the device 2. For comparison, a reference sample having the same structure as the evaluation sample except that the former has a fluorine-free MgO layer as an insulating layer was fabricated separately. Finally, a 20-nm-thick Ta film as the wiring electrode 406 was formed on the insulating layer 402. The formation method of the Ta film was the same as the formation method of the Ta film in the device 2.

The multilayer film thus obtained was divided into pieces, and resist patterns with dimensions ranging from 5 μm×5 μm to 32 μm×32 μm were formed by photolithography on the divided multilayer films. Before the photolithography, some of the divided multilayer films were subjected to heat treatment for 1 hour at 300° C. in a vacuum at a pressure of $10^{-5}$ Pa. Next, the multilayer films were each etched by Ar ion milling until the interface between the first ferromagnetic layer 401 and the wiring electrode layer 404 was exposed. Next, the resist resin was removed with an organic solvent, and then the surface was cleaned by UV ozone cleaning. For each of the evaluation samples thus obtained, a current-voltage measurement (IV measurement) between the first ferromagnetic layer 401 and the wiring electrode 406 that sandwich the insulating layer 402 was performed using an atomic force microscope (AFM) 13 as a contact probe and a semiconductor parameter analyzer (4156C, manufactured by Agilent Technologies) 14, as shown in FIG. 11. The IV measurement was performed two or more times with a gradually increasing voltage from ±0.3 V to ±1 V being applied to the samples. In order to enhance the stability of electrical contact between the samples and the probe of the AFM, a probe obtained by depositing a 5-nm-thick Ta/500-nm-thick Cu/5-nm-thick Ta multilayer film by sputtering on the surface of an AFM probe (SI-DF20) manufactured by SII Nano Technology Inc. was used as the probe. The sputtering deposition conditions were the same as those for the respective films used for the fabrication of the device 2.

The barrier height $\phi$ (eV) and the barrier width (Å) of the insulating layer for tunneling current were obtained by fitting analysis of the obtained IV curve using the Simmons' formula for an intermediate applied voltage range (John G. Simmons, Journal of Applied Physics, vol. 34, No. 9, pp. 2581 (1963)). For the analysis, the range of applied voltages in the IV measurement was selected so that the barrier height obtained by the IV measurement fell within the range of one half to one third of the barrier height $\phi$ obtained by the analysis. The barrier height and the barrier width obtained by the analysis were determined as the barrier height and the barrier width of each sample.

Figure 12A:
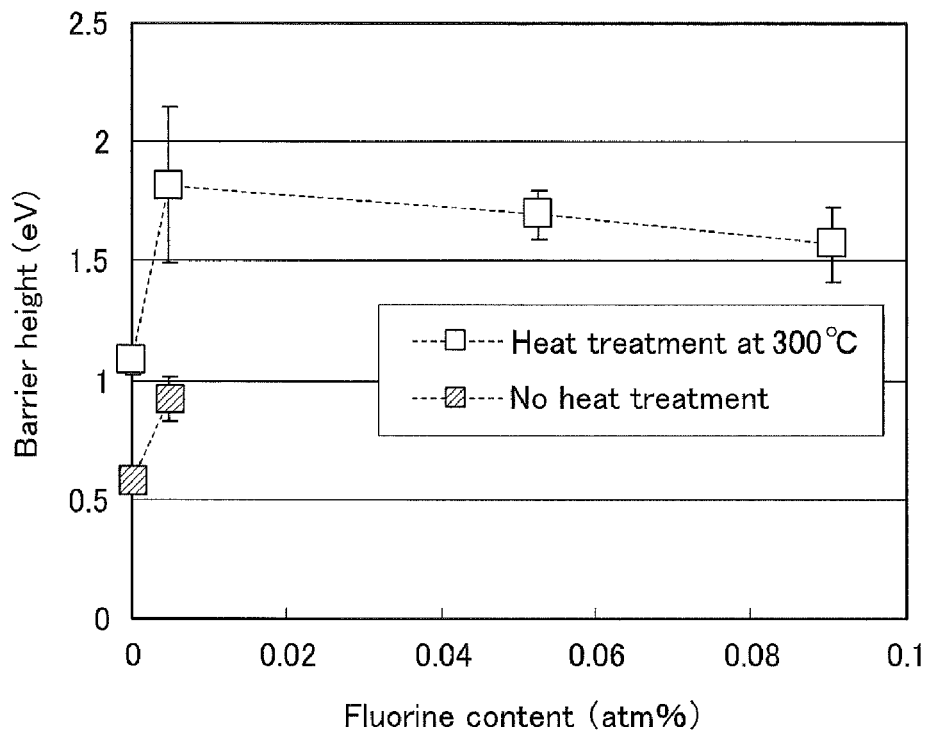
FIG. 12A is a diagram showing the relationship between the fluorine contents in the insulating layers and the barrier heights of the insulating layers, evaluated in Examples.
Figure 12B:
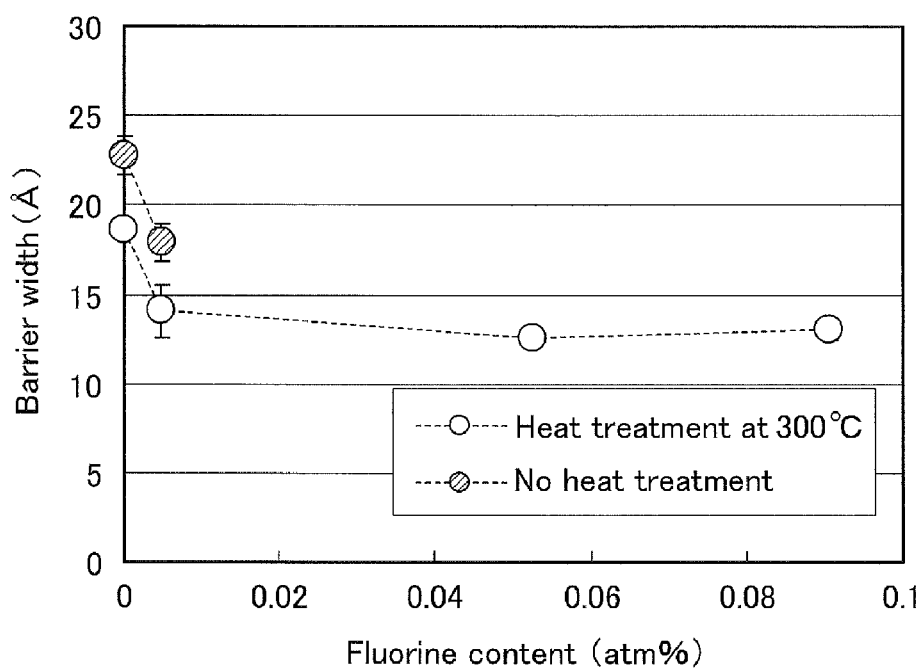
FIG. 12B is a diagram showing the relationship between the fluorine contents in the insulating layers and the barrier widths of the insulating layers, evaluated in Examples.

FIG. 12A and Table 4 below show the relationship between the fluorine content in the insulating layer and the barrier height of the insulating layer. FIG. 12B and Table 4 below show the relationship between the fluorine content in the insulating layer and the barrier width of the insulating layer. An insulating layer having a greater barrier height and a smaller barrier width exhibits superior properties when used in a magnetic tunnel junction device.

TABLE 4

| Sample name | Deposition conditions for insulating layer | Fluorine content (at. %) | Heat treatment (at 300° C.) | | No heat treatment | |
|---|---|---|---|---|---|---|
| | | | Barrier height φ (eV) | Barrier width (Å) | Barrier height φ (eV) | Barrier width (Å) |
| Reference sample | Reference conditions | 0.00000 | 1.08 | 18.7 | 0.58 | 22.8 |
| IV sample 1 | Conditions A | 0.00487 | 1.82 | 14.1 | 0.92 | 17.9 |
| IV sample 2 | Conditions C | 0.05256 | 1.70 | 12.6 | — | — |
| IV sample 3 | Conditions D | 0.09058 | 1.57 | 13.0 | — | — |

As shown in FIG. 12A, FIG. 12B, and Table 4, both the barrier heights and the barrier widths of the IV samples 1 to 3 having fluorine contents in insulating layers ranging from 0.00487 at. % to 0.15080 at. % were improved, compared to those of the reference sample having a fluorine content of zero. Particularly the barrier heights and the barrier widths of the IV samples 1 and 2 having fluorine contents in insulating layers of 0.00487 at. % or more and 0.05256 at. % or less, and more particularly the barrier height and the barrier width of the IV sample 1 having the smallest fluorine content were significantly improved. In addition, the barrier height and the barrier width of the not heat-treated sample left as deposited were improved. Therefore, it was confirmed that heat treatment is not essential for these improvements in the magnetoresistance properties by the addition of fluorine.

The same results were obtained also when a $Co_{20}Fe_{60}B_{20}$ film was used instead of a $Co_{40}Fe_{40}B_{20}$ film as the first ferromagnetic layer 401. The same results were obtained also when a 1.8-nm-thick insulating layer and a 2.2-nm-thick insulating layer were used.

Figure 13:
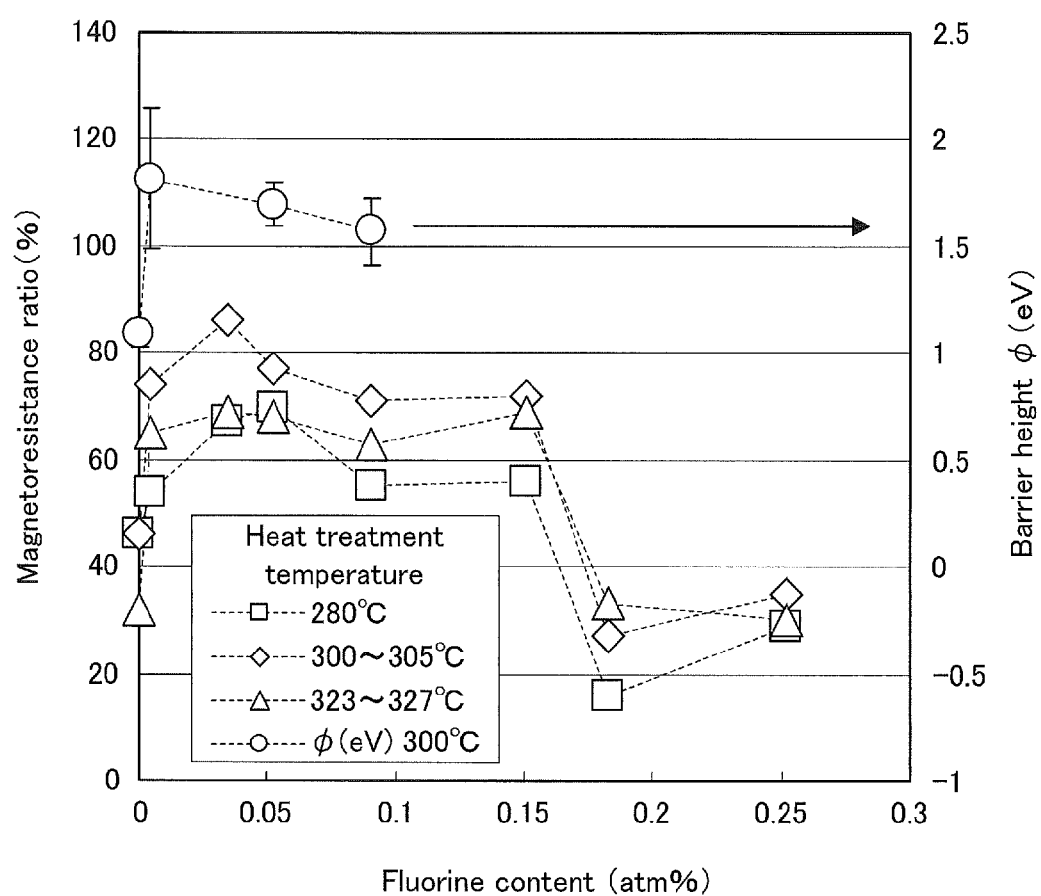
FIG. 13 is a diagram showing the relationship between the fluorine contents in the insulating layers, and the magnetoresistance ratios of the magnetic tunnel junction devices including the insulating layers and the barrier heights of the insulating layers, evaluated in Examples.
Figure 14:
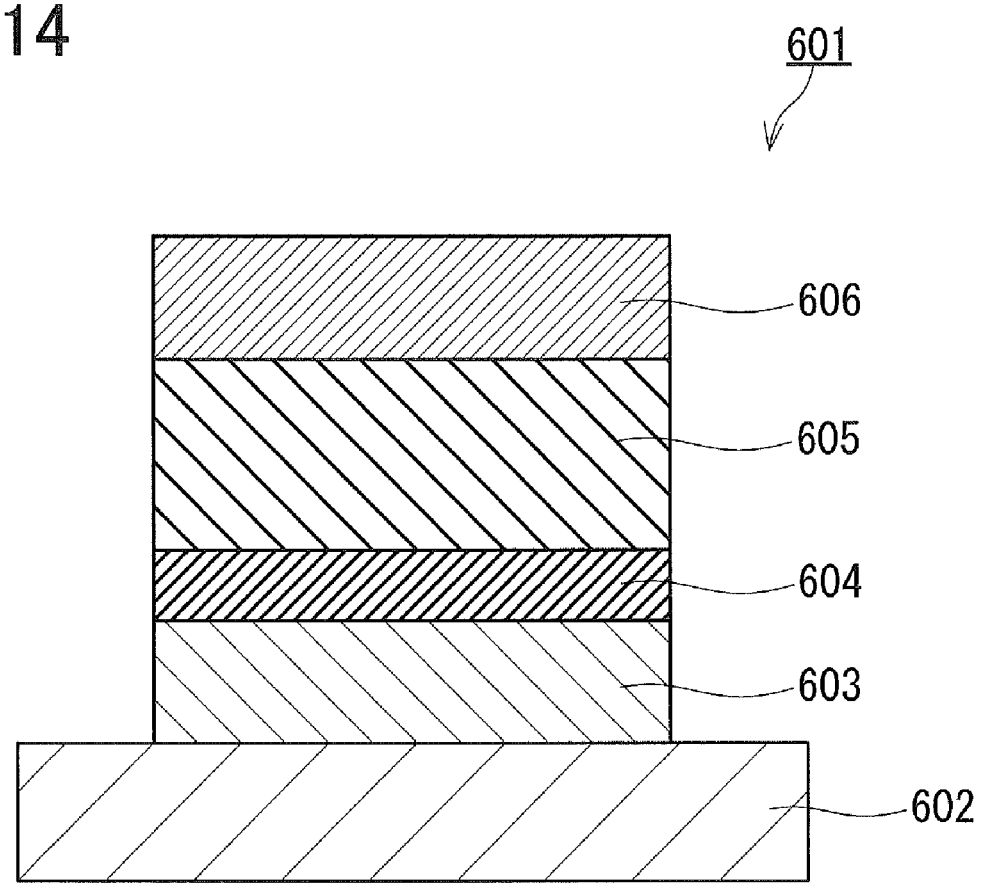
FIG. 14 is a cross-sectional view schematically showing the structure of a conventional magnetic tunnel junction device disclosed in a prior art document.
Figure 15A:
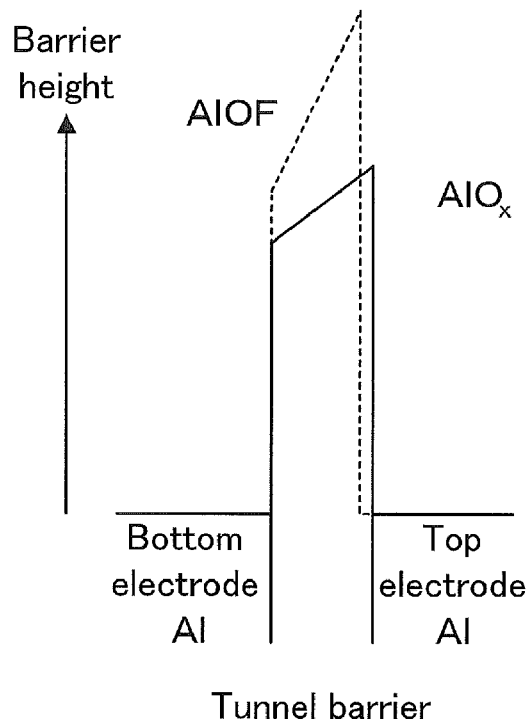
FIG. 15A is a schematic diagram showing the barrier heights of insulating layers (an $AlO_x$ layer and an AlOF layer) in conventional magnetic tunnel junction devices disclosed in a prior art document.
Figure 15B:
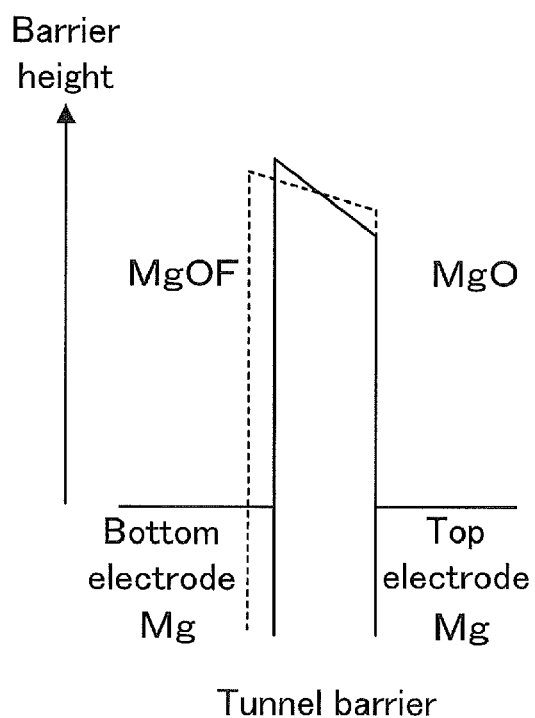
FIG. 15B is a schematic diagram showing the barrier heights of insulating layers (a MgO layer and a MgOF layer) in conventional magnetic tunnel junction devices disclosed in a prior art document.
Figure 16:
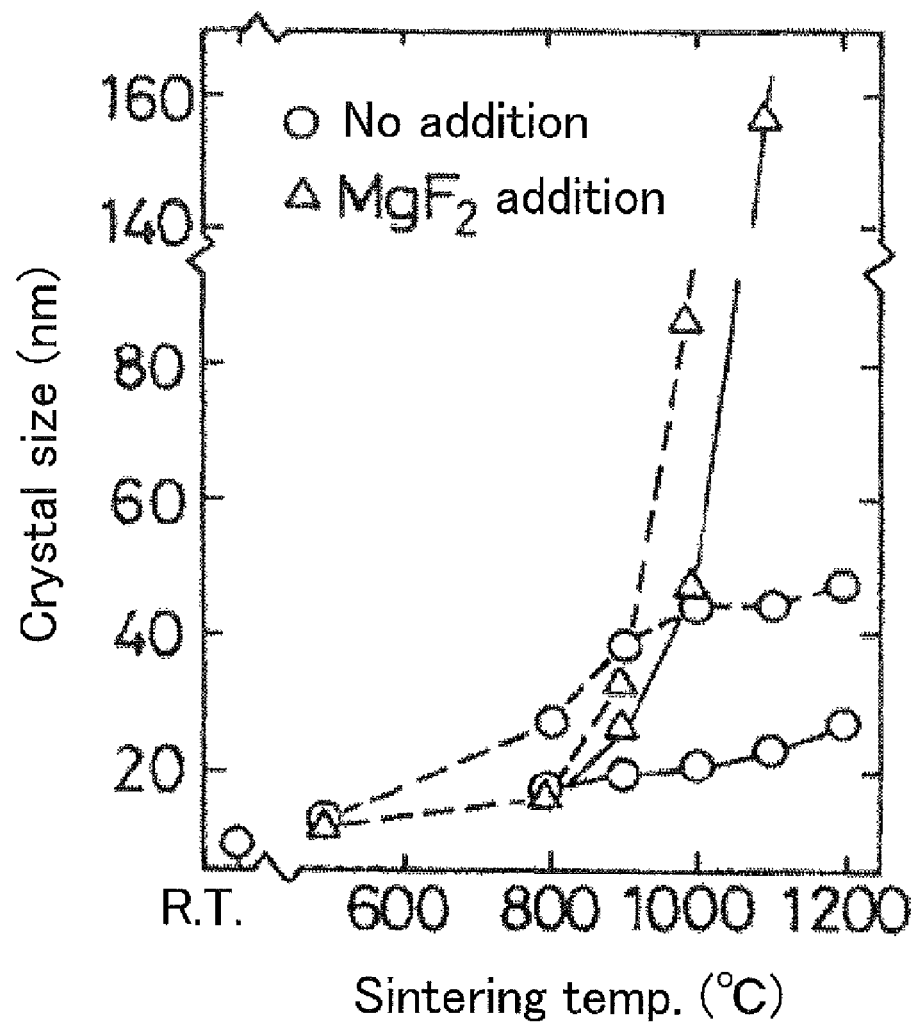
FIG. 16 is a diagram showing the effect of $MgF_2$ addition during sintering of MgO ceramic bulk, disclosed in a prior art document.

FIG. 13 collectively shows the above evaluation results of the magnetoresistance ratios (MR ratios) and the barrier heights.

As shown in FIG. 13, the MR ratios of the devices were improved when the fluorine contents in the insulating layers were in the range of 0.00487 at. % or more and 0.15080 at. % or less, and the highest ratio was obtained at 0.03441 at. %. The barrier heights of all the insulating layers of the fluorine-added samples were improved, and the ranking was as follows: IV sample 1 (with a fluorine content of 0.00487 at. %)≈IV sample 2 (with a fluorine content of 0.005256 at. %)>IV sample 3 (with a fluorine content of 0.09058 at. %)>>reference sample (with no fluorine added).

According to the above results, good results were obtained when the fluorine content in the insulating layer was 0.00487 at. % or more and 0.15080 at. % or less, and particularly good results were obtained when the fluorine content was in the range from 0.00487 at. % to 0.05256 at. %.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The magnetic tunnel junction device of the present invention can be used for the same applications as conventional magnetic tunnel junction devices. For example, it can be used in magnetic random access memories, magnetic read heads, magnetic sensors, current sensors, and biosensors using magnetic markers.

What is claimed is:

1. A magnetic tunnel junction device comprising:
   a first ferromagnetic layer;
   a second ferromagnetic layer; and
   an insulating layer formed between the first ferromagnetic layer and the second ferromagnetic layer, wherein
   the insulating layer is composed of fluorine-added MgO, and
   a fluorine content in the insulating layer is 0.00487 at. % or more and 0.15080 at. % or less.

2. The magnetic tunnel junction device according to claim 1, wherein the fluorine content is 0.00487 at. % or more and 0.05256 at. % or less.

3. The magnetic tunnel junction device according to claim 1, wherein at least one layer selected from the first ferromagnetic layer and the second ferromagnetic layer is composed of a Co—Fe—B alloy.

4. The magnetic tunnel junction device according to claim 3, wherein the first ferromagnetic layer is composed of a Co—Fe—B alloy represented by the formula $\{Co_{(1-x)}Fe_x\}_{0.8}B_{0.2}$, where x is a numerical value that satisfies $0.25 \leq x \leq 0.5$.

5. The magnetic tunnel junction device according to claim 3, wherein the second ferromagnetic layer is composed of a Co—Fe—B alloy represented by the formula $\{Co_{(1-y)}Fe_y\}_{0.8}B_{0.2}$, where y is a numerical value that satisfies $0.25 \leq y \leq 0.50$.

* * * * *